(12) United States Patent
Lee et al.

(10) Patent No.: US 11,663,008 B2
(45) Date of Patent: May 30, 2023

(54) MANAGING MEMORY DEVICE WITH PROCESSOR-IN-MEMORY CIRCUIT TO PERFORM MEMORY OR PROCESSING OPERATION

(71) Applicant: SAMSUNG ELECTRONICS CO., LTD., Suwon-si (KR)

(72) Inventors: Sukhan Lee, Seoul (KR); Shinhaeng Kang, Suwon-si (KR); Namsung Kim, Yongin-si (KR); Seongil O, Suwon-si (KR); Hak-Soo Yu, Hanam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/814,462

(22) Filed: Mar. 10, 2020

(65) Prior Publication Data

US 2020/0293319 A1 Sep. 17, 2020

Related U.S. Application Data

(60) Provisional application No. 62/816,509, filed on Mar. 11, 2019.

(30) Foreign Application Priority Data

Dec. 6, 2019 (KR) .................. 10-2019-0161674

(51) Int. Cl.
*G06F 9/30* (2018.01)
*G06F 9/32* (2018.01)
*G06F 15/78* (2006.01)

(52) U.S. Cl.
CPC .......... *G06F 9/30145* (2013.01); *G06F 9/321* (2013.01); *G06F 15/7821* (2013.01)

(58) Field of Classification Search
CPC ... G06F 9/30145; G06F 15/7821; G06F 9/321
See application file for complete search history.

(56) References Cited

U.S. PATENT DOCUMENTS 6,237,079 B1 3/2001 Stoney
6,564,271 B2 5/2003 Micalizzi, Jr. et al.
(Continued)

FOREIGN PATENT DOCUMENTS

| CN | 107408404 | 11/2017 |
|----|-----------|---------|
| CN | 108885595 | 11/2018 |
| KR | 10-1867219 | 6/2018 |

OTHER PUBLICATIONS

Wikipedia entry entitled Program Counter. 5 pages, last edited on Oct. 28, 2020. Accessed Nov. 19, 2021. Retrieved from Internet <https://en.wikipedia.org/wiki/Program_counter>.*

(Continued)

*Primary Examiner* — Shawn Doman
(74) *Attorney, Agent, or Firm* — F. Chau & Associates, LLC

(57) ABSTRACT

A memory device includes a memory having a memory bank, a processor in memory (PIM) circuit, and control logic. The PIM circuit includes instruction memory storing at least one instruction provided from a host. The PIM circuit is configured to process an operation using data provided by the host or data read from the memory bank and to store at least one instruction provided by the host. The control logic is configured to decode a command/address received from the host to generate a decoding result and to perform a control operation so that one of i) a memory operation on the memory bank is performed and ii) the PIM circuit performs a processing operation, based on the decoding result. A counting value of a program counter instructing a position of the instruction memory is controlled in response to the (Continued)

command/address instructing the processing operation be performed.

17 Claims, 18 Drawing Sheets

(56) References Cited

U.S. PATENT DOCUMENTS

| | | | |
|---|---|---|---|
| 6,782,461 B2 | 8/2004 | Lam | |
| 7,797,519 B2 | 9/2010 | Terashima | |
| 8,583,898 B2 | 11/2013 | Greyzck | |
| 9,507,600 B2 | 11/2016 | Wiencke et al. | |
| 9,997,232 B2 | 6/2018 | Murphy | |
| 10,061,590 B2 * | 8/2018 | Wheeler | G06F 9/3877 |
| 10,289,542 B2 | 5/2019 | Zawodny et al. | |
| 10,474,581 B2 | 11/2019 | Willcock et al. | |
| 10,970,441 B1 * | 4/2021 | Zhang | G06F 30/33 |
| 2004/0193842 A1 | 9/2004 | Kirsch | |
| 2005/0251791 A1 | 11/2005 | Hundt | |
| 2006/0036779 A1 * | 2/2006 | Kim | G06F 13/4027 |
| | | | 710/8 |
| 2010/0262979 A1 | 10/2010 | Borchers et al. | |
| 2010/0312998 A1 * | 12/2010 | Walker | G06F 15/7821 |
| | | | 712/221 |
| 2011/0072238 A1 | 3/2011 | Mimar | |
| 2011/0093662 A1 * | 4/2011 | Walker | G06F 3/0659 |
| | | | 711/147 |
| 2011/0231827 A1 * | 9/2011 | Kilbane | G06F 11/362 |
| | | | 717/129 |
| 2012/0215991 A1 * | 8/2012 | Moyer | G06F 12/1441 |
| | | | 711/152 |
| 2013/0036314 A1 * | 2/2013 | Glew | G06F 12/1408 |
| | | | 713/194 |
| 2013/0169642 A1 * | 7/2013 | Frascati | G06F 9/445 |
| | | | 345/426 |
| 2014/0115278 A1 | 4/2014 | Redford et al. | |
| 2014/0136811 A1 * | 5/2014 | Fleischer | G06F 15/7821 |
| | | | 711/207 |
| 2014/0281149 A1 * | 9/2014 | Roberts | G06F 12/0292 |
| | | | 711/103 |
| 2015/0046660 A1 * | 2/2015 | Kim | G06F 12/0833 |
| | | | 711/146 |
| 2016/0041856 A1 | 2/2016 | Sankaralingam et al. | |
| 2016/0283232 A1 | 9/2016 | Sade et al. | |
| 2017/0060588 A1 | 3/2017 | Choi | |
| 2017/0177498 A1 * | 6/2017 | Wilkes | G06F 12/1027 |
| 2017/0278584 A1 * | 9/2017 | Rosti | G11C 29/16 |
| 2017/0344301 A1 | 11/2017 | Ryu et al. | |
| 2017/0344480 A1 * | 11/2017 | Beard | G06F 12/08 |
| 2018/0032458 A1 * | 2/2018 | Bell | G06F 11/3037 |
| 2018/0107406 A1 | 4/2018 | O et al. | |
| 2018/0239712 A1 * | 8/2018 | Lea | G06F 12/1045 |
| 2018/0322164 A1 | 11/2018 | Dasari et al. | |
| 2018/0329832 A1 * | 11/2018 | Takaku | G06F 9/30047 |
| 2018/0336035 A1 | 11/2018 | Choi et al. | |
| 2019/0034097 A1 | 1/2019 | Chang et al. | |
| 2019/0138893 A1 * | 5/2019 | Sharma | G11C 7/1039 |
| 2019/0188082 A1 | 6/2019 | Lee | |
| 2019/0198082 A1 | 6/2019 | O | |
| 2019/0258487 A1 | 8/2019 | Shin et al. | |
| 2020/0020393 A1 * | 1/2020 | Al-Shamma | G11C 16/08 |
| 2020/0035291 A1 | 1/2020 | Kasibhatla | |

OTHER PUBLICATIONS

Office Action dated Dec. 22, 2020 in Related to U.S. Appl. No. 16/813,851.
Office Action dated Dec. 28, 2020 in Related to U.S. Appl. No. 16/810,344.
Office Action dated Feb. 23, 2022 in Related U.S. Appl. No. 16/814,236.
Office Action dated Jul. 11, 2022 in Related U.S. Appl. No. 16/814,236.
First Office Action dated Apr. 12, 2023 in corresponding IN Patent Application No. 202044010291.

* cited by examiner

Row Address Map

MANAGING MEMORY DEVICE WITH PROCESSOR-IN-MEMORY CIRCUIT TO PERFORM MEMORY OR PROCESSING OPERATION

CROSS-REFERENCE TO RELATED APPLICATIONS

This U.S. non-provisional patent application claims priority to U.S. Provisional Application No. 62/816,509, filed on Mar. 11, 2019, in the U.S. Patent and Trademark Office and claims the benefit of priority under 35 U.S.C. § 119 to Korean Patent Application No. 10-2019-0161674, filed on Dec. 6, 2019, in the Korean Intellectual Property Office, the disclosures of which are incorporated by reference in their entireties herein.

BACKGROUND

1. Technical Field

The inventive concept relates to a memory device, and more particularly, to a memory device for processing an operation, a data processing system including the same, and a method of operating the memory device.

2. Discussion of Related Art

A semiconductor memory device is a digital electronic semiconductor device used for digital data storage, such as computer memory. A capacity and speed of semiconductor memory devices used for high performance operations is ever increasing. Examples of semiconductor memory devices include a volatile memory such as a dynamic random access memory (DRAM), which determines data by charges stored in a capacitor.

A memory device including DRAM may be used to store data operated on by various kinds of operations such as a neural network operation or an arithmetic operation. A large amount of operations may be efficiently processed by a processor in memory (PIM) circuit in the memory device.

SUMMARY

At least one embodiment of the inventive concept provides a memory device capable of improving operation efficiency and performance when operations are processed by using a processor in memory (PIM) circuit in the memory device, a data processing system including the same, and a method of operating the memory device.

According to an exemplary embodiment of the inventive concept, there is provided a memory device, including a memory having a memory bank including memory cells, a processor in memory (PIM) circuit, and control logic. The PIM circuit includes instruction memory storing at least one instruction provided from a host. The PIM circuit is configured to process an operation using data provided by the host or data read from the memory bank and to store at least one instruction provided by the host. The control logic is configured to decode a command/address received from the host to generate a decoding result and to perform a control operation so that one of i) a memory operation on the memory bank is performed and ii) the PIM circuit performs a processing operation, based on the decoding result. A counting value of a program counter instructing a position of the instruction memory is controlled in response to the command/address instructing the processing operation be performed.

According to an exemplary embodiment of the inventive concept, a method of operating a memory device including a plurality of memory banks is provided. The method includes: storing a plurality of instructions received from a host that correspond to a processing operation; decoding a command/address received from the host to determine whether the address belongs to one of a first range and a second range; performing a memory operation corresponding to the received command/address when it is determined that the address corresponds to the first range; and reading an instructed instruction among the plurality of instructions and a processor in memory (PIM) circuit provided in the memory device and performing a processing operation corresponding to the read instruction, when it is determined that the address belongs to the second range.

According to an exemplary embodiment of the inventive concept, data processing system including a host is provided. The host includes an address map memory and a memory interface. The address map memory is configured to store a plurality of addresses that belong to a first range for instructing a memory operation to be performed on a memory device and a plurality of addresses that belong to a second range for instructing a processing operation to be performed using data read from a selected memory bank among memory banks of the memory device. The memory interface is configured to instruct that the memory operation be performed by outputting an address that belongs to the first range and to instruct that the processing operation be performed by outputting an address that belongs to the second range.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EXEMPLARY EMBODIMENTS

Hereinafter, exemplary embodiments of the inventive concept will be described in detail with reference to the accompanying drawings.

Figure 1:
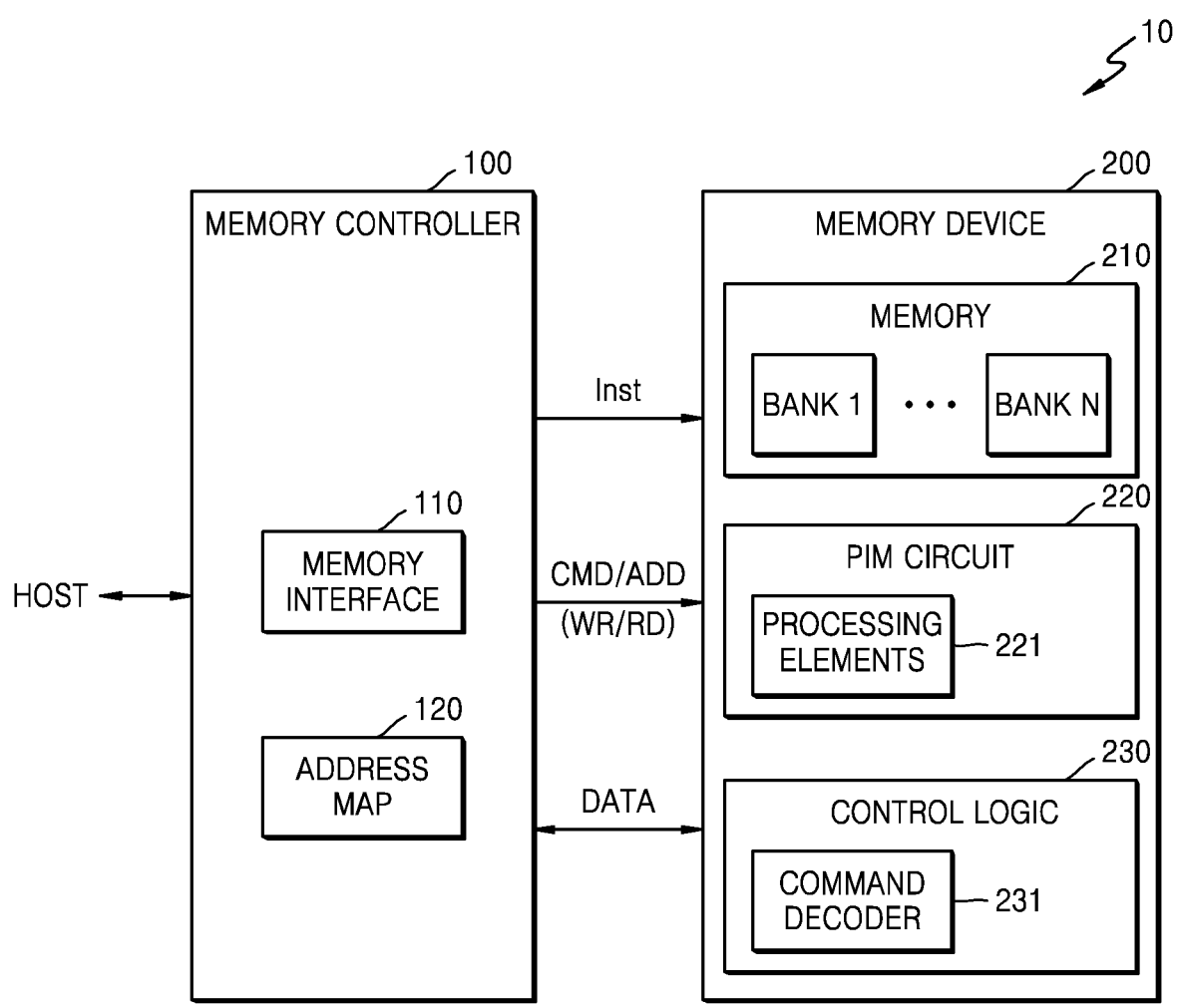
FIG. 1 is a block diagram illustrating a data processing system including a memory device according to an exemplary embodiment of the inventive concept.

FIG. 1 is a block diagram illustrating a data processing system 10 including a memory device according to an exemplary embodiment of the inventive concept.

Referring to FIG. 1, the data processing system 10 include a memory controller 100 (e.g., a control circuit) and a memory device 200. The memory controller 100 may include a memory interface 110 (e.g., an interface circuit) and an address map 120 and may provide various signals to the memory device 200 through the memory interface 110 and may control memory operations such as writing and reading. The address map 120 may be stored in a memory or a register of the memory controller 100. For example, the memory controller 100 may provide a command CMD and an address ADD to the memory device 200 to access data DATA of the memory device 200. The command CMD may include a write command WR requesting data to be written and a read command RD requesting data to be read.

The memory controller 100 may access the memory device 200 in accordance with a request (e.g., a message or signal) from a host HOST (e.g., a host device) and the memory interface 110 may provide an interface with the memory device 200. The memory controller 100 may communicate with the host HOST by using various protocols. For example, the memory controller 100 may communicate with the host HOST by using an interface protocol such as peripheral component interconnect-express (PCI-E), advanced technology attachment (ATA), serial ATA (SATA), parallel ATA (PATA), or serial attached SCSI (SAS). In addition, each of other various interface protocols such as universal serial bus (USB), multi-media card (MMC), enhanced small disk interface (ESDI), and integrated drive electronics (IDE) may be applied as a communication protocol between the host HOST and the memory controller 100. Alternatively, according to exemplary embodiments, the memory controller 100 may correspond to the host HOST or a component included in the host HOST.

The memory device 200 includes a memory 210, a processor in memory (PIM) circuit 220, and control logic 230 (e.g., logic circuit). The control logic 230 include a command decoder 231 (e.g., a decoder circuit). In addition, the memory 210 includes a plurality of memory banks BANK 1 to BANK N and each of the memory banks BANK 1 to BANK N may include a plurality of memory cells (or a cell array including memory cells). A bank may be variously defined. For example, the bank may be defined as a component including memory cells or a component including one or more peripheral circuits together with the memory cells.

A bank in which data access is to be performed may be selected using the address ADD received from the memory controller 100. In addition, memory cells in the bank may be selected. In addition, the command decoder 231 may perform a decoding operation on a command/address CMD/ADD received from the memory controller 100 to generate a decoding result and the control logic 230 may perform an internal control operation on the memory device 200 so that a memory operation is performed in accordance with the decoding result.

On the other hand, the memory device 200 may be dynamic random access memory (DRAM) such as double data rate synchronous dynamic random access memory (DDR SDRAM), low power double data rate (LPDDR), SDRAM, graphics double data rate (GDDR) SDRAM, or rambus dynamic random access memory (RDRAM). However, embodiments of the inventive concept are not limited thereto. For example, a memory device 200A may be implemented by non-volatile memory such as flash memory, magnetic RAM (MRAM), ferroelectric RAM (FeRAM), phase change RAM (PRAM), or resistive RAM (ReRAM).

In addition, the memory device 200 may correspond to a semiconductor chip or a channel in a memory device including a plurality of channels having independent interfaces. Alternatively, the memory device 200 may correspond to a memory module. Alternatively, the memory module may include a plurality of memory chips and the memory device 200 of FIG. 1 may correspond to a memory chip mounted on a module board.

Hereinafter, according to exemplary embodiments of the inventive concept, an example in which the PIM circuit 220 of the memory device 200 processes operations is described. Various kinds of operation processing operations may be performed in the memory device 200. For example, in relation to artificial intelligence (AI), at least parts of neural network operations may be performed in the memory device 200. For example, the host HOST may control the memory device 200 through the memory controller 100 so that at least parts of the neural network operations are performed by the memory device 200. In addition, in the following embodiment, it will be described that the memory controller 100 controls the memory device 200. However, embodiments of the inventive concept are need limited thereto. For example, the memory controller 100 may correspond to a component included in the host HOST where the host HOST controls the memory device 200.

The memory controller 100 may transmit one or more instructions Inst to the memory device 200 in order to process operations using data. The memory device 200 may receive a plurality of instructions Inst and may store the received instructions Inst therein. For example, the PIM circuit 220 may include one or more processing elements 221 (e.g., processors or logic circuits) and instruction memory (not shown) for storing the instructions Inst. Then, when the command/address CMD/ADD that instruct operations to be processed are received from the memory controller 100, the processing elements 221 may process an operation corresponding to the instruction Inst read from the instruction memory.

According to exemplary embodiments of the inventive concept, the memory controller 100 may transmit a plurality of instructions Inst to the memory device 200 so that a plurality of operations may be serially processed. For example, before the operations are processed, a mode (for example, an instruction loading mode) for loading the plurality of instructions Inst in instruction memory (not shown) may be performed. In the instruction loading mode, the plurality of instructions Inst may be loaded in the instruction memory of the memory device 200.

On the other hand, the memory controller 100 may perform a control operation so that the memory device 200 processes the operations by using commands related to a normal memory operation. For example, a bit value of an address ADD provided by the memory controller 100 may be divided into a plurality of ranges. For example, in accordance with the bit value, the address ADD may belong to a first range instructing a memory operation or a second range instructing operations to be processed. The memory controller 100 may manage the address map 120. The address map 120 may manage addresses that belong to the first range and addresses that belong to the second range. In addition, information on the addresses included in the address map 120 may be stored in a prescribed memory in the memory controller 100.

The memory device 200 may selectively perform a memory operation or an operation processing operation in response to the command/the address CMD/ADD from the memory controller 100. For example, the memory device 200 may process an operation in response to a data write or read command WR/RD from the memory controller 100.

As an operation example, the memory controller 100 may transmit the address ADD that belongs to the first range to the memory device 200 together with a write command WR and the data for writing or a read command RD. In this case, the command decoder 231 of the memory device 200 may perform a decoding operation on the received command/address CMD/ADD and, when a value of the address ADD belongs to the first range, performs a memory operation of writing data DATA in or reading data DATA from a position instructed by the address ADD of a memory bank of the memory 210. On the other hand, when the value of the address ADD belongs to the second range, based on a result of decoding the command/the address CMD/ADD, the PIM circuit 220 enters an operation processing mode and processes an operation. For example, the processing elements 221 of the PIM circuit 220 may process the operation by using the data DATA provided by the memory controller 100 or the data DATA read from a memory bank of the memory 210.

In addition, for example, the address ADD includes a plurality of bits and, in accordance with a value of at least one bit of a specific position in the plurality of bits, the address ADD may belong to the first range or the second range. In addition, at least some of the remaining bits excluding the bit in the specific position of the address ADD may include information (for example, a row address and a column address) instructing the position of the data DATA. As an operation example, the PIM circuit 220 may read the data DATA through the information representing the position in a memory bank of the memory 210 from the address ADD and may process an operation by using the read data DATA.

According to the above-described embodiment of the inventive concept, since the operation is processed by the PIM circuit 220 of the memory device 200 in response to the command/the address CMD/ADD from the memory controller 100 independent of a request from the host HOST, it is possible to prevent a memory operation request from the memory controller 100 from colliding with the operation processing operation of the memory device 200. For example, for the memory operation or operation processing, a row of a memory bank of the memory 210 may be activated. The memory controller 100 may determine provision timing of the command/address CMD/ADD for the memory operation and operation processing. In addition, a position of a bank, a position of the activated row, and a position of an accessed column may be determined by the memory controller 100.

In addition, according to an embodiment of the inventive concept, when a transaction for the memory operation is generated by the memory controller 100 while the memory device 200 processes an operation, the memory operation may be delayed until operation processing has completed or for a time spent on stopping an operation processing. However, according to embodiments of the inventive concept, since the memory controller 100 or the host HOST including the memory controller 100 may control the operation processing timing of the memory device 200, it is possible to prevent performance from deteriorating due to the above-described collision.

On the other hand, in the embodiment illustrated in FIG. 1, the processing elements 221 may include various numbers of processing elements. For example, each of the processing elements 221 may be arranged to correspond to one bank or no less than two banks.

On the other hand, a position of data DATA on which operation processing is to be performed may be instructed by various methods. For example, as described above, information on selection of a bank may be included in the address ADD accompanied by the command CMD for operation processing. Alternatively, information on a bank in which data DATA to be used for an operation is positioned may be included in each instruction Inst. Alternatively, the memory device 200 may be implemented so that the position of the data to be used for operation processing is instructed based on a combination of the information stored in the instruction Inst and the information stored in the address ADD.

Figure 2:
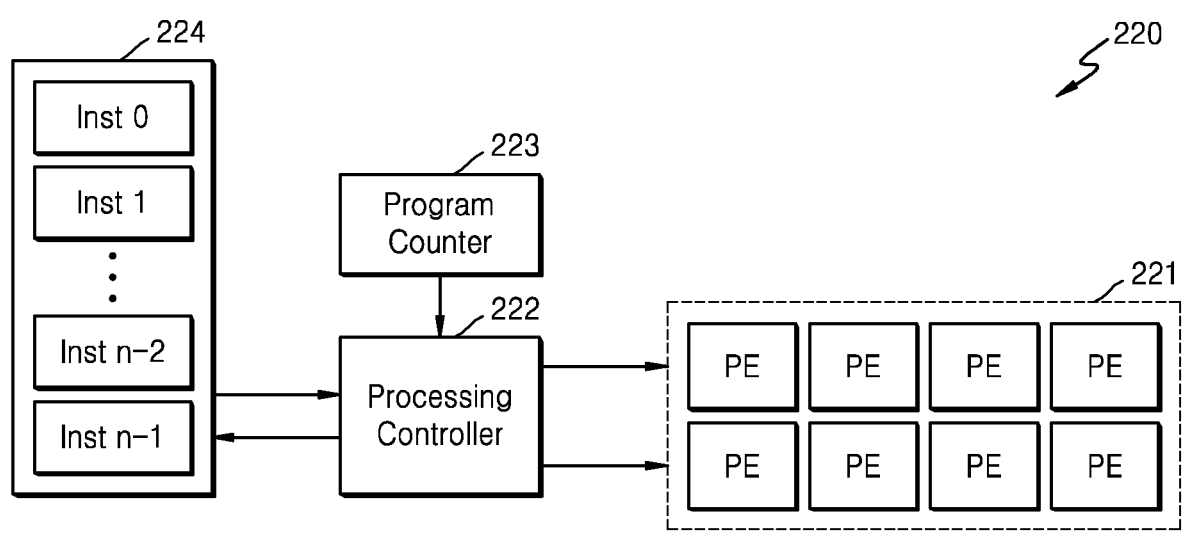
FIG. 2 is a block diagram illustrating an implementation example of a processor in memory (PIM) circuit of the memory device of FIG. 1.

FIG. 2 is a block diagram illustrating an implementation example of a processor in memory (PIM) circuit of the memory device 200 of FIG. 1.

Referring to FIGS. 1 and 2, the PIM circuit 220 includes the processing elements 221, a processing controller 222 (e.g., a control circuit), a program counter 223 (e.g., a counting circuit), and instruction memory 224. For example, the processing elements 221 may include a plurality of processing elements PE to correspond to a plurality of banks BANK 1 to BANK N and may process operations corresponding to instructions Inst loaded in the instruction memory 224. In addition, each of the plurality of processing elements PE may include a register (not shown). An operand on which an operation processing (or a processing operation) is to be performed to generate an operation processing result and/or the operation processing result may be temporarily stored in the register.

On the other hand, the processing controller 222 may control an overall operation related to operation processing in the memory device 200. The processing controller 222 may read an instruction Inst stored in the instruction memory 224 when a command/address CMD/ADD that instructs an operation to be processed are received from the memory controller 100 and may control the processing elements PE so that the operation corresponding to the read instruction Inst may be processed.

In an exemplary embodiment, a plurality of instructions Inst 0 to Inst n-1 may be stored in or sequentially read from the instruction memory 224. As an operation example, the program counter 223 may instruct an instruction to be read from the memory 224 by performing a program counting operation. For example, in response to the command/address CMD/ADD instructing the operation to be processed from the memory controller 100, an instruction in a position corresponding to a current counting value of the program counter 223 is read and a counting value may be increased based on the program counting operation. Alternatively, according to various embodiments, in response to the command/address CMD/ADD instructing the operation to be processed, the current counting value of the program counter 223 is increased and an instruction may be read from a position corresponding to the increased counting value.

In storing the plurality of instructions Inst 0 to Inst n-1 in the instruction memory 224, various methods may be applied. For example, an address is assigned to the instruction memory 224 and the assigned address may be provided by the memory controller 100 in an instruction loading process. For example, the memory controller 100 may provide an address along with an instruction to the memory device 200 that indicates a location within the instruction memory 224 to store the instruction. In addition, by applying a circular queue based storage method, a size of the instruction memory 224 may be reduced by overwriting an instruction. For example, the instruction memory 224 may store a fixed number of instructions and when a new instruction is received beyond the fixed number, the oldest instruction or a least recently used instruction stored within the instruction memory 224 can be overwritten with the new instruction.

On the other hand, the processing controller 222 may control a route of data DATA on which operation processing is to be performed based on the decoded command/address CMD/ADD. For example, in the memory device 200, circuits (not shown) for controlling a route of data DATA provided to or read from a memory bank of the memory 210 may be included and the circuits may be controlled so that data DATA to be used for an operation may be provided to the processing elements PE. According to various embodiments, based on control of the processing controller 222 or control of the control logic 230, data DATA from the host HOST may be provided to the processing elements PE. Alternatively, the data DATA may be read from a position instructed by the address ADD of a memory bank of the memory 210 and may be provided to the processing elements PE.

Like in the embodiment illustrated in FIG. 2, a plurality of instructions for processing operations are previously loaded and, in response to the command/address CMD/ADD instructing an operation to be processed from the host HOST, an operation corresponding to a read instruction may be processed. In addition, address information (for example, a row address and a column address) for instructing data DATA used for an operation processing operation may be included in the command/address CMD/ADD instructing the operation to be processed from the host HOST. That is, when the memory device 200 processes an operation independent from a request from the host HOST, the address information needs to be previously stored in the memory device 200 in order to process the operations in accordance with the plurality of instructions. However, according to at least one embodiment of the inventive concept, since the address information for processing an operation does not need to be previously stored in the memory device 200, a size of a storage space required for processing an operation may be reduced.

According to the above-described embodiments, regardless of the order of the instructions Inst 0 to Inst n-1 provided by the host HOST, the instructions Inst 0 to Inst n-1 may be stored in the instruction memory 224. For example, when the instructions Inst 0 to Inst n-1 process the same kind of operation, since an operand on which the operation is to be processed may be instructed by an address instructed by the host HOST, regardless of the order of the executed instructions Inst 0 to Inst n-1, an operation required by the host HOST may be processed to generate an operation result.

Figure 3:
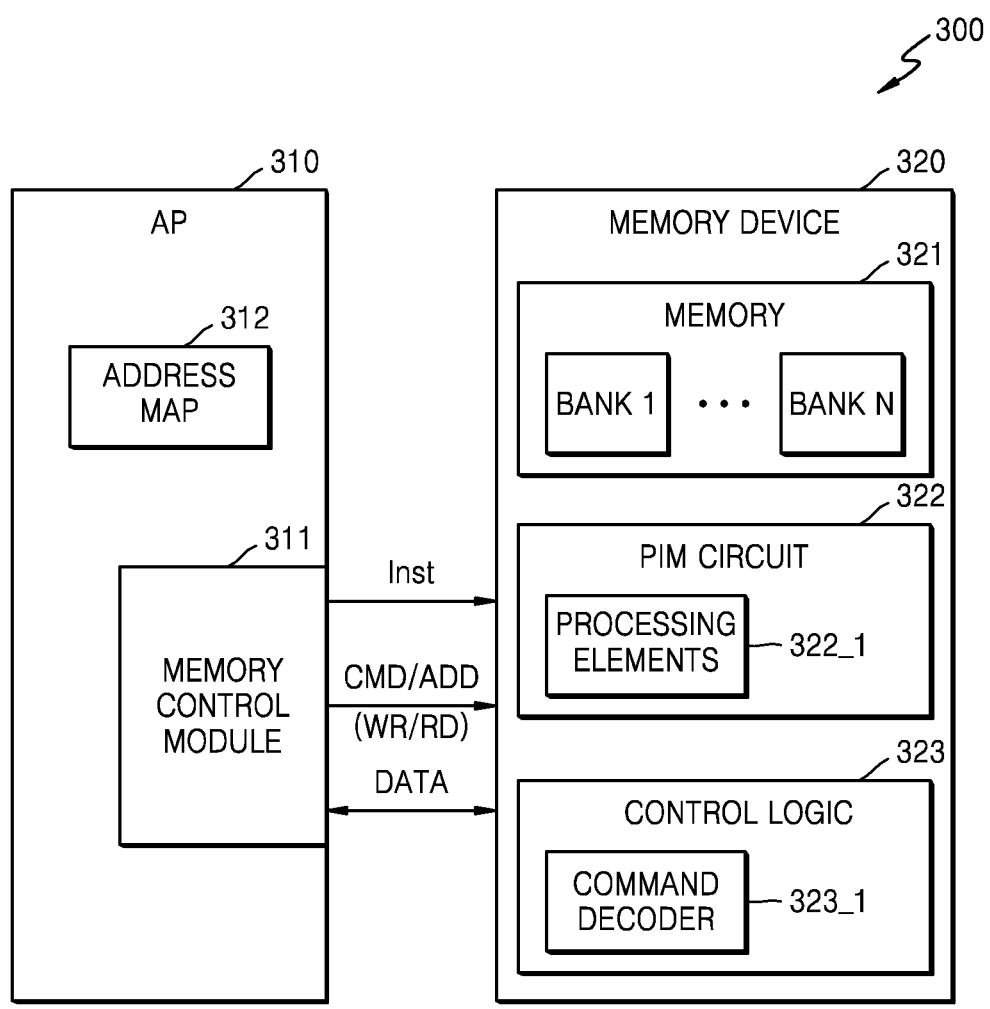
FIG. 3 is a block diagram illustrating a data processing system including a memory device according to an exemplary embodiment of the inventive concept.

FIG. 3 is a block diagram illustrating a data processing system 300 including a memory device according to an exemplary embodiment of the inventive concept. As illustrated in FIG. 3, the data processing system 300 includes an application processor 310 and a memory device 320 and the application processor 310 includes a memory control module 311 that communicates with the memory device 320. For example, the application processor 310 and the memory device 320 may configure a memory system.

On the other hand, the application processor 310 may function as the host HOST of FIG. 1 and may include an address map 312 for managing first addresses related to the memory operation and second addresses related to operation processing according to the above-described embodiments. In FIG. 3, the address map 312 is illustrated as being provided outside the memory control module 311. However, like in the above-described embodiment, the address map 312 may be provided in the memory control module 311.

On the other hand, the application processor 310 may be implemented by a system on chip (SoC) including a system bus (not shown). As a standard specification of the system bus, the advanced microcontroller bus architecture (AMBA) protocol of advanced RISC machine (ARM) may be applied. A bus type of the AMBA protocol may be an advanced high-performance bus (AHB), an advanced peripheral bus (APB), an advanced extensible interface (AXI), AXI4, or AXI coherency extensions (ACE). Other than the above bus types, another type of protocol such as the uNetwork of SONICs Inc., the CoreConnect of IBM, or the open core protocol of OCP-IP may be applied.

The memory control module 311 may function as the memory controller in the above-described embodiment and may control the memory operation or the operation processing operation in the memory device 320 by transmitting the command/address CMD/ADD to the memory device 320. The memory device 320 includes a memory 321, a PIM circuit 322, and control logic 323. The PIM circuit 322 includes processing elements 322_1, and the control logic 323 includes a command decoder 323_1. The application processor 310 may provide a plurality of instructions Inst to the memory device 320 in order to process operations in the memory device 320 and the plurality of instructions Inst may be stored in an instruction memory (not shown) in the memory device 320. In addition, when the command/address CMD/ADD instructing the operation to be processed is provided to the memory device 320, processing elements 322_1 may process the operation by using data DATA from the application processor 310 and/or data DATA read from the memory 321.

Figure 4:
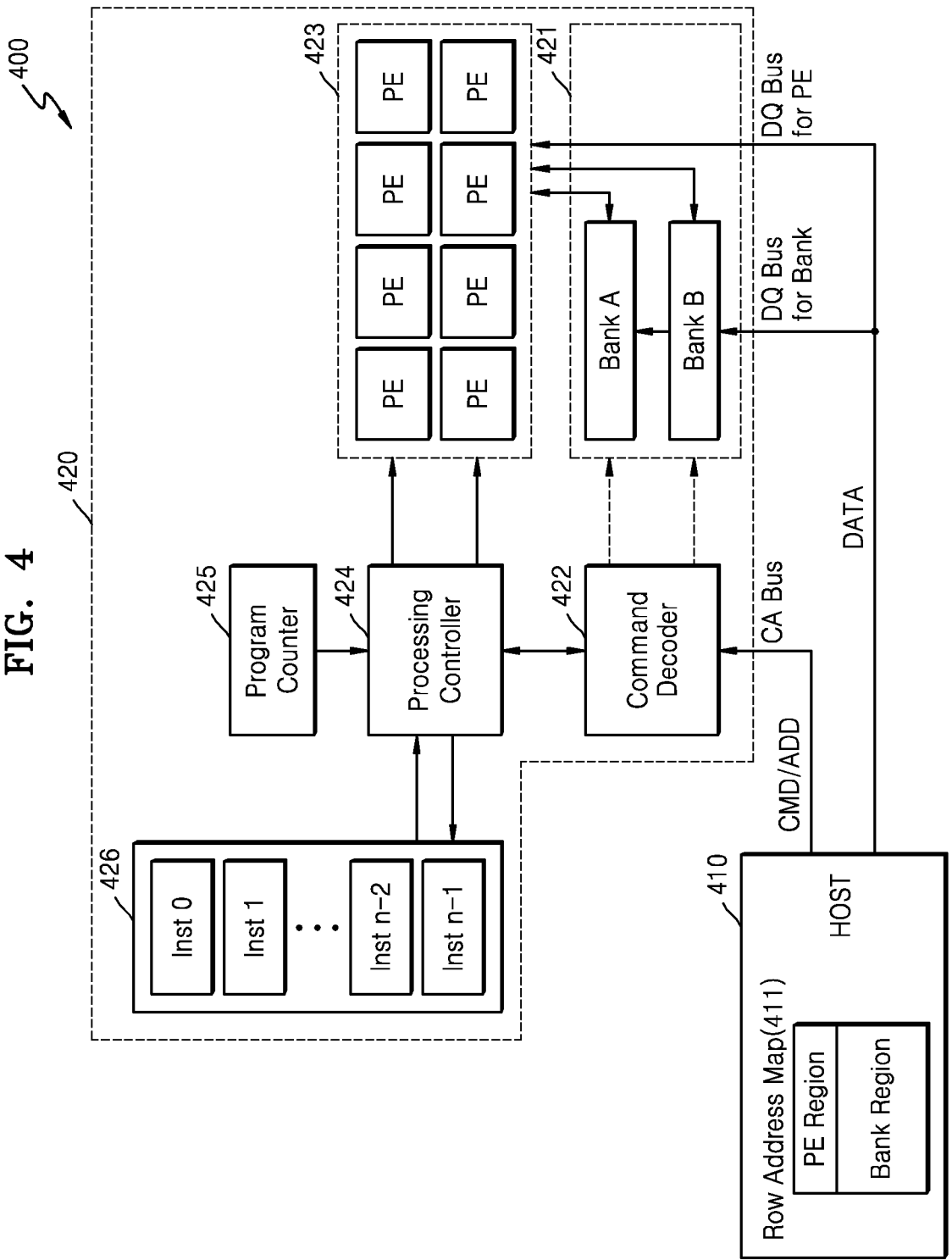
FIG. 4 is a block diagram illustrating an implementation example of a data processing system according to an exemplary embodiment of the inventive concept.

FIG. 4 is a block diagram illustrating an implementation example of a data processing system 400 according to an exemplary embodiment of the inventive concept.

Referring to FIG. 4, the data processing system 400 includes a host 410 and a memory device 420. Although not shown in FIG. 4, the host 410 may include a memory controller like in the above-described embodiments and further includes an address map 411. For example, the host 410 may manage an address range for instructing a memory operation and an address range for instructing an operation processing as a row address. Therefore, the address map 411 may be referred to as a row address map. The address map 411 may be stored in memory (not shown) provided in the host 410.

Like in the above-described embodiment, a value of a row address in a first range for instructing a memory operation and a value of a row address in a second range for instructing an operation to be processed may be defined and the host 410 may manage the row addresses in the first and second ranges. For example, a row address may include a plurality of bits and, in accordance with a value of at least one bit of the plurality of bits, the first range may be distinguished from the second range. In addition, the remaining bits of the plurality of bits may include information representing a position of a row activated in a bank including a plurality of rows. In addition, according to an exemplary embodiment, the row address in the first range may be stored in one region (for example, a bank region) of the address map 411 and the row address in the second range may be stored in the other region (for example, a PE region).

The host 410 may communicate with the memory device 420 through a plurality of buses BUS, for example, a command/address bus CA BUS, a data bus for a memory operation DQ BUS for BANK, and a data bus for an operation processing operation DQ BUS for PE. The memory device 420 includes a memory bank 421, a command decoder (or a control logic) 422, processing elements 423, a processing controller 424, a program counter 425, and instruction memory 426. Some of the components illustrated in FIG. 4 may form the PIM circuit in the above-described embodiment.

The command decoder 422 may receive the command/address CMD/ADD and may perform a decoding operation on the command/address CMD/ADD. When the received address ADD corresponds to the address in the first range, which is included in the bank region, the memory device 420 may store data DATA in a selected bank of the memory bank 421 based on a result of decoding the command/address CMD/ADD.

On the other hand, when the received address ADD corresponds to the address in the second range, which is included in the PE region, the command decoder 422 may transmit the command/address CMD/ADD to the processing controller 424. According to various embodiments, the command decoder 422 may transmit the received command/address CMD/ADD to the processing controller 424 or may transmit the result of decoding the command/address CMD/ADD to the processing controller 424.

In an exemplary embodiment, after the processing controller 424 receives the command/address CMD/ADD instructing an operation to be processed, the processing controller 424 reads an instruction Inst stored in a region instructed by the program counter 425 and may control a counting operation of the program counter 425. In addition, the processing controller 424 may select a processing element PE for processing an operation based on the command/address CMD/ADD and the instruction Inst and may control the selected processing element PE. In addition, data DATA received through the data bus for an operation processing operation DQ BUS for PE is provided to the selected processing element PE and an operation may be processed using the data DATA.

Alternatively, information representing a storage position of data DATA on which operation processing is to be performed may be included in the received address ADD and the processing controller 424 and/or the command decoder 422 may perform a control operation so that data DATA read from the memory bank 421 by using the address ADD may be provided to the selected processing element PE through an internal bus. The processing element PE may store a result of processing an operation by using the data DATA provided by the host HOST or read from the memory bank 421 in a register (not shown) therein.

Figure 5:
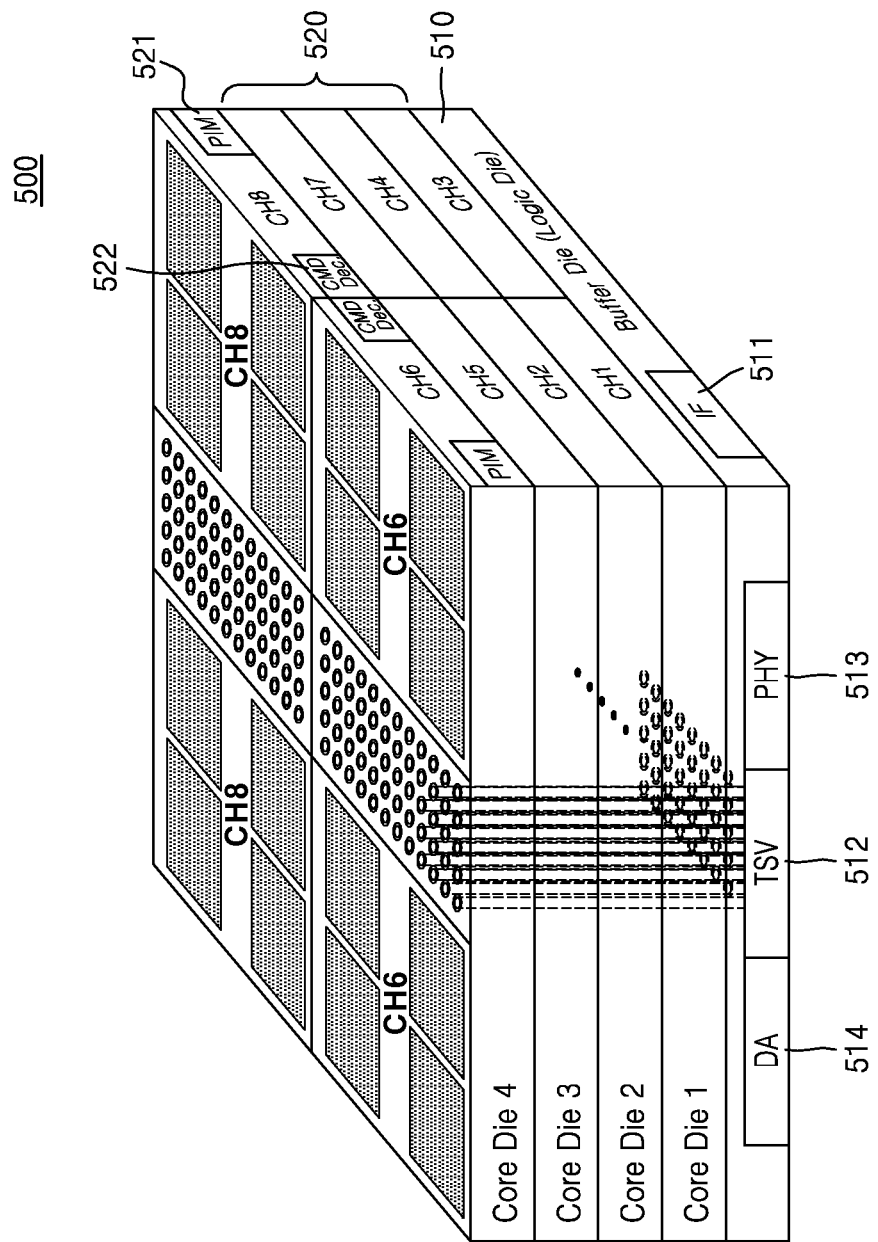
FIG. 5 is a block diagram illustrating an example in which a memory device according to an exemplary embodiment of the inventive concept includes high bandwidth memory (HBM)

FIG. 5 is a block diagram illustrating an example in which a memory device according to an exemplary embodiment of the inventive concept includes high bandwidth memory (HBM) 500.

The HBM 500 includes a plurality of channels having independent interfaces and may have an increased bandwidth. Referring to FIG. 5, the HBM 500 may include a plurality of dies, for example, a buffer die (or a logic die 510) and one or more core dies 520 stacked on the buffer die (or the logic die 510). In FIG. 5, an example in which four core dies are included in the HBM 500 is illustrated. However, the number of core dies 520 may vary.

In addition, each of the core dies 520 may include one or more channels. In an example of FIG. 5, when each of the core dies 520 includes two channels, the HBM 500 includes eight channels CH1 to CH8. For example, a first core die may include first and third channels CH1, CH3, a second core die may include second and fourth channels CH2 and CH4, a third core die may include fifth and seventh channels CH5 and CH7, and a fourth core die may include sixth and eighth channels CH6 and CH8.

The buffer die 510 may include an interface circuit 511 that communicates with a host (or a memory controller) and may receive a command/address and data from the host through the interface circuit 511. The host may transmit the command/address and the data through buses arranged to correspond to the channels. The buses may be formed to correspond to the channels or each of some of the buses may be shared by at least two channels. The interface circuit 511 may transmit the command/address and the data to a channel requested by the host to perform a memory operation or to process an operation. In addition, according to an exemplary embodiment of the inventive concept, each of the core dies 520 and each of the channels may include a PIM circuit 521 and a command decoder 522 and the command decoder 522 may control a decoding operation performed on the received command/address.

The host may provide the command/address and the data so that at least some of a plurality of operations may be processed by the HBM 500. The operations may be processed by the PIM circuit 521 of a channel instructed by the host. For example, according to the above-described embodiments, when the received command/address instructs the memory operation, an access operation may be performed on the data. On the other hand, when the received command/address instructs an operation to be processed, the PIM circuit 521 may process an operation by using data from the host and/or data read from a corresponding channel.

According to an exemplary embodiment, each of the channels may include a plurality of banks and one or more processing elements may be provided in the PIM circuit 521 of each of the channels. For example, in each of the channels, the number of processing elements may be the same as the number of banks of the channel. Alternatively, when the number of processing elements is less than the number of banks, one processing element may be shared by at least two banks.

The buffer die 510 may further include a through-silicon via (TSV_ region 512, a physical PHY region 513, and a direct access region DA 514. Although not shown in FIG. 5, a processor for controlling an overall operation of the HBM 500 such as control of a route of data may be further included in the buffer die 510.

In the TSV region 512, a TSV for communications with the core dies 520 is formed. In addition, the physical PHY region 513 may include a plurality of input and output circuits for communications with an external host. For example, the physical PHY region 513 may include one or more ports for communications with the host. On the other hand, the direct access region DA 514 may be arranged to directly communicate with an external tester (e.g., external device used for performing tests) through a conductive unit (e.g., a conductive pad) arranged on an external surface of the HBM 500 in a test mode of the HBM 500.

Figure 6:
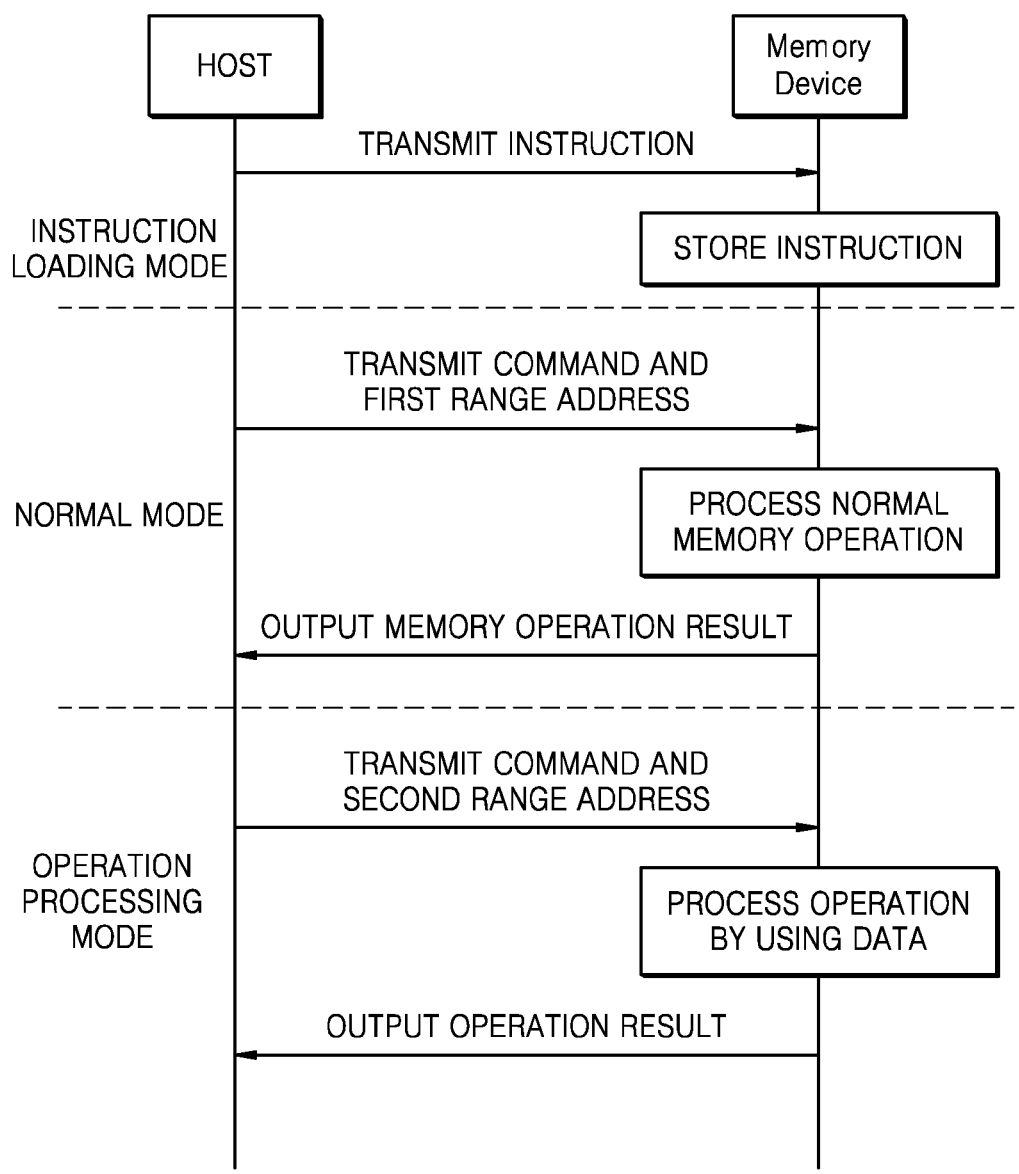
FIG. 6 is a conceptual diagram illustrating an operation example of a memory system according to an exemplary embodiment of the inventive concept.

FIG. 6 is a conceptual diagram illustrating an example of an operation of a memory system according to an exemplary embodiment of the inventive concept. In FIG. 6, an example in which a memory device communicates with the host HOST is illustrated and, in the host HOST, a memory controller (or a memory control module) that communicates with the memory device may be provided.

Referring to FIG. 6, the host HOST may control various operation modes of the memory device and, while the memory device operates in the instruction loading mode, the host HOST may transmit a plurality of instructions required for processing operations to the memory device. The transmitted instructions may be stored in the memory device. For example, various kinds of operations such as addition, subtraction, and multiplication may be processed by the memory device and the PIM circuit may determine kinds of the operations by reading the instructions in the operation processing mode and decoding the read instructions.

The host HOST may perform a control operation so that the memory device operates in a normal mode. For example, the host HOST may transmit the command/address CMD/ADD including an address in a first range for instructing the memory operation to the memory device. The memory device may decode the received command/address CMD/ADD and may perform the memory operation in response to the address that belongs to the first range. In addition, after the memory operation is completely processed to generate a memory operation result, the memory operation result may be output to the host HOST. For example, data read in response to a read command may be output to the host HOST. Alternatively, a response representing that a data writing operation has completed may be output to the host HOST in response to a write command.

On the other hand, the host HOST may transmit the command/address CMD/ADD including the address in the second range for instructing an operation to be processed to the memory device. The memory device decodes the received command/address CMD/ADD and may enter an operation processing mode in response to the address that belongs to the second range. For example, after data is received from the host HOST together with the command/address CMD/ADD, an operation may be processed by using the data received from the host HOST to generate an operation processing result. In addition, the operation processing result may be transmitted to the host HOST. For example, after the operation processing operation has completed, the result may be transmitted to the host HOST. Alternatively, according to an exemplary embodiment, the operation processing result may be stored in a register in a processing element or a cell array of a bank and the host HOST may transmit the command/address CMD/ADD for reading the operation processing result to the memory device.

Figure 7:
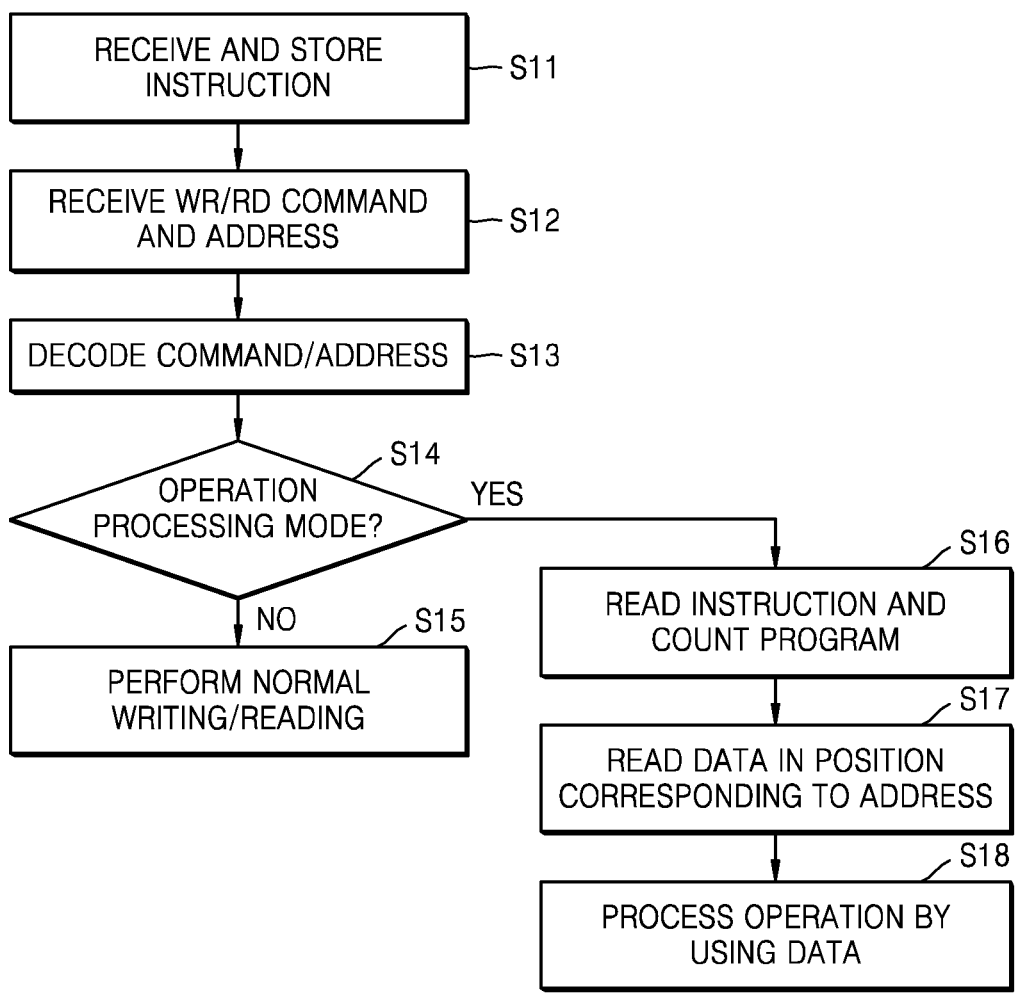
FIGS. 7 and 8 are flowcharts illustrating a method of operating a memory device according to an exemplary embodiment of the inventive concept.
Figure 8:
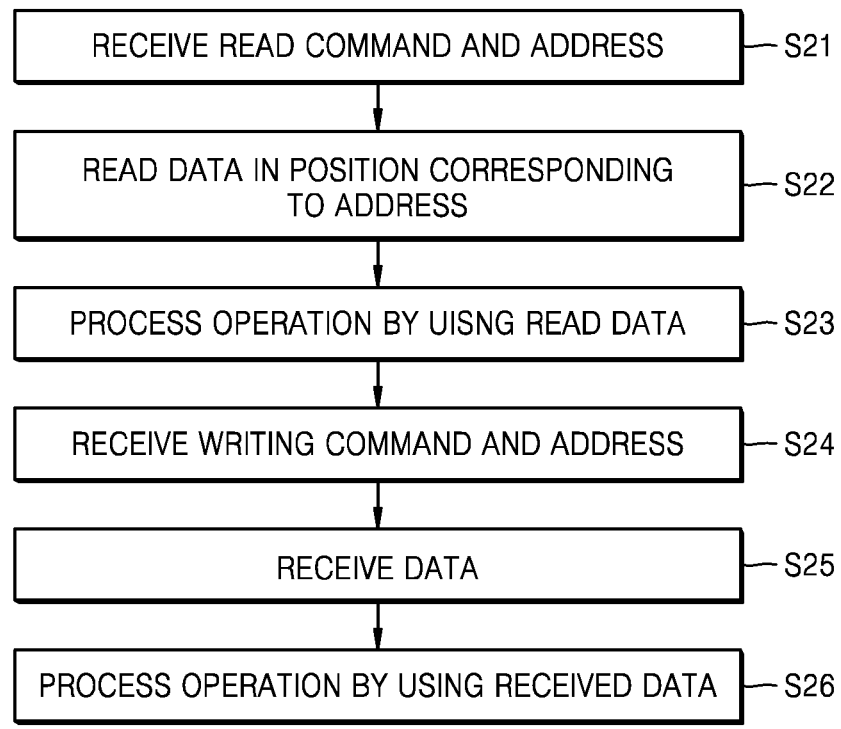

FIGS. 7 and 8 are flowcharts illustrating a method of operating a memory device according to an exemplary embodiment of the inventive concept.

Referring to FIG. 7, the memory device receives an instruction provided by a host in an instruction loading mode and stores the received instruction in operation S11. The memory device may receive various kinds of commands from the host and may perform various functions by using a result of decoding the commands. The memory device receives a write/read command WR/RD from the host and receives an address corresponding to the write/read command WR/RD in operation S12. In addition, the memory device performs a decoding operation on the received command/address to generate a decoding result in operation S13.

The memory device determine whether to operate in an operation processing mode or a memory operation mode based on the decoding result in operation S14. For example, the address received according to the above-described embodiments may have a bit value that belongs to a first range or a second range and, and when the bit value of the received address belongs to the first range, the memory device performs a normal writing/reading operation corresponding to the received command/address in operation S15. For example, the memory device performs a normal writing/reading operation during the memory operation mode. On the other hand, when the bit value of the received address belongs to the second range, the memory device enters the operation processing mode. For example, a part of the address having the bit value be referred to a mode information that is set to one of the memory operation mode and the operation processing mode.

In the operation processing mode, a PIM circuit provided in the memory device may perform a single operation or a series of operations for processing an operation. The command/address from the host may be provided to the PIM circuit and the PIM circuit may read an instruction instructed by a program counter among instructions stored in instruction memory and perform a program counting operation in operation S16. According to the above-described operation, the instructions stored in the instruction memory may be sequentially read.

On the other hand, address information representing a position in which data to be used for an operation is stored may be included in the command/address for instructing an operation to be processed. Based on a control operation in the memory device, data is read from the position corresponding to the received address and may be provided to the PIM circuit in operation S17 and the PIM circuit processes an operation by using the read data in operation S18.

On the other hand, referring to FIG. 8, various commands for the operation processing operation may be defined between the host and the memory device and, in processing the operation by using the write command and the read command, an operation processing method may be set to be different in accordance with a command.

According to an exemplary embodiment, the host provides the read command as a command for processing an operation to the memory device and the memory device receives the read command and the address from the host in operation S21. The memory device may process the operation based on a decoding operation on the command/address and the command/address for entering the operation processing mode may be defined by various methods. For example, according to the above-described embodiments, when the bit value of the address may belong to the first range or the second range and the address that belongs to the first range is provided to the memory device, the memory device may operate in the operation processing mode.

When the read command is provided to the memory device, an operation may be processed on data read from a memory cell array. In the address accompanied by the read command, information (for example, a bank address, a row address, and a column address) on a position in which data to be read from the memory cell array is stored may be included. The memory device reads data in a position corresponding to the received address in operation S22 and, after the read data is provided to the PIM circuit, an operation is processed by using the read data in operation S23.

On the other hand, when the write command is provided to the memory device, the memory device may be controlled so that an operation may be processed by using data provided by the host. For example, the memory device receives the write command and the address in operation S24 and performs a decoding operation on the write command and the address. The memory device receives data from the host in operation S25. The received data may be provided to the PIM circuit. The PIM circuit may process an operation (performs an operation) by using the data received from the host to generate an operation processing result in operation S26. In addition, the operation processing result may be temporarily stored in a register in the PIM circuit.

According to an exemplary embodiment, in the address received together with the write command, information for instructing a position of data may be included. For example, the memory device may be implemented so that, when the write command is provided to the memory device, the memory device processes the operation by using the data from the host to generate a processing result and the processing result is stored in a position instructed by the received address.

Figure 9:
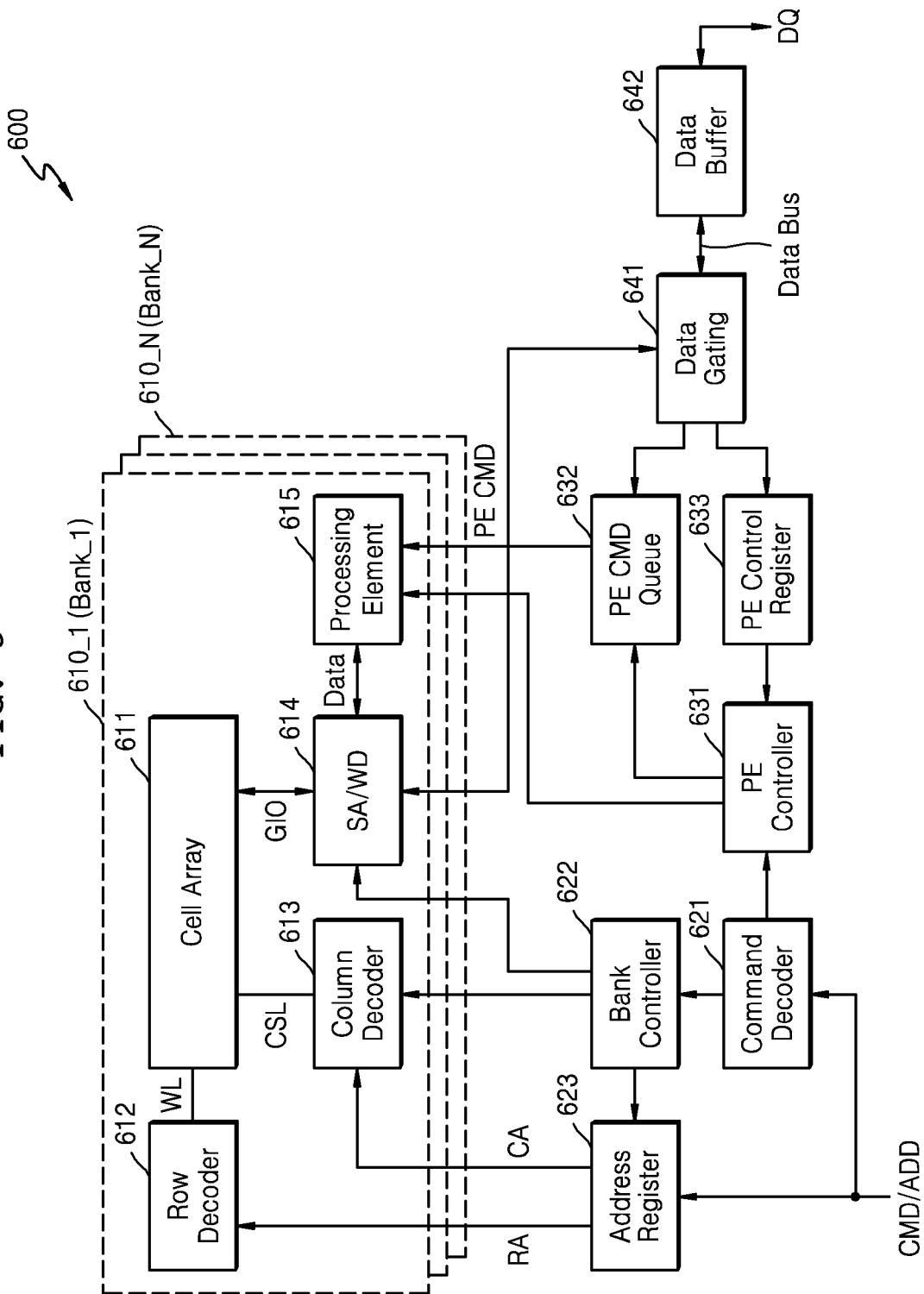
FIG. 9 is a block diagram illustrating an overall implementation example of a memory device according to an exemplary embodiment of the inventive concept.

FIG. 9 is a block diagram illustrating an overall implementation example of a memory device 600 according to an exemplary embodiment of the inventive concept. Some of the components illustrated in FIG. 9 are optional and may be removed. Alternatively, some of the components illustrated in FIG. 9 may be divided into at least two components in terms of functionality. Alternatively, two or more of the components may be united into one component.

That is, the memory device according to an embodiment of the inventive concept may be variously implemented as long as the memory device performs the same function or similar functions.

Referring to FIG. 9, the memory device 600 includes a plurality of banks 610_1 to 610_N and the plurality of banks 610_1 to 610_N may be implemented in a same manner as the bank illustrated in FIG. 3. For example, the bank 610_1 includes a cell array 611, a row decoder 612 (e.g., a decoder circuit), a column decoder 613 (e.g., a decoder circuit), a sense amplifier/write driver 614, and a processing element 615. That is, each bank may be defined as including memory cells and various peripheral circuits related to a memory operation.

The memory device 600 further includes a command decoder 621, a bank controller 622, an address register 623, a processing element controller 631, a PE command queue 632, a PE control register 633, a data gating unit 641 (e.g., gating circuit), and a data buffer 642. The various components illustrated in FIG. 9 may correspond to the components in the above-described embodiments. For example, the command decoder 621, the bank controller 622, and the address register 623 may be provided in the control logic and the processing element controller 631 and/or the PE control register 633 may be provided in the PIM circuit in the above-described embodiments. On the other hand, the PE command queue 632 may correspond to the instruction memory in the above-described embodiments and a PE command from the PE command queue 632 may correspond to the instruction in the above-described embodiments.

The row decoder 612 may select a row of the bank 610_1 through a word line WL and the column decoder 613 may select a column of the bank 610_1 through a column selection line CSL. In addition, the sense amplifier/write driver 614 may access memory cells of the cell array 611 through a global input and output line GIO and writing data and reading data may be transmitted between the sense amplifier/write driver 614 and the data gating unit 641.

According to an exemplary embodiment, an instruction (or a PE command) is provided by the host through a data input and output pad DQ of the memory device 600. In addition, the host may provide various PE control information items on control of an operation of the processing element 615 to the memory device 600 through the data input and output pad DQ and the processing element controller 631 may control the processing element 615 based on information stored in the PE control register 633. In addition, based on control of the processing element controller 631, an instruction stored in the PE command queue 632 may be provided to the processing element 615.

According to the above-described embodiments, based on the command/address CMD/ADD provided by the host, the command decoder 621 and/or the processing element controller 631 may control an overall operation of the memory device 600 and accordingly, the memory device 600 may operate in a normal mode or an operation processing mode.

Figure 10:
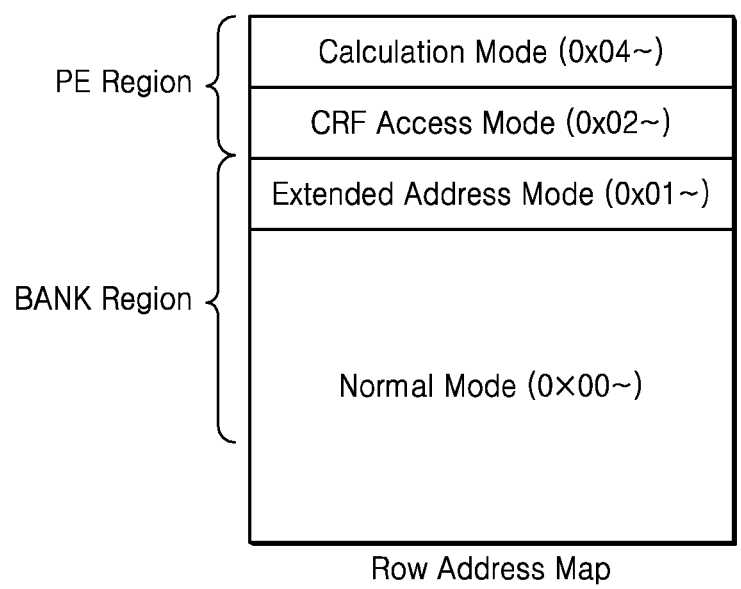
FIG. 10 is a block diagram illustrating an implementation example of an address map provided in a host.

FIG. 10 is a block diagram illustrating an implementation example of an address map provided in a host.

Referring to FIG. 10, the host includes the address map (for example, a row address map) and may manage row addresses for instructing various modes through the address map. The row addresses may belong to various ranges in accordance with bit values thereof. In the above-described embodiments, the normal mode and the operation processing mode are illustrated. However, various modes may be performed by managing the address map.

For example, a range to which some bits (for example, some upper bits) of a row address belong may be set in accordance with values of the bits. For example, by the host providing a row address in which the values of the bits correspond to 00x0, the memory device may operate in a normal mode (for example, a writing and reading operation). In addition, in an exemplary embodiment, in an extended address mode, a plurality of banks of the memory device may be simultaneously selected. For example, in order to perform a precharge operation on the plurality of banks, the extended address mode may be selected.

In addition, in relation to operation processing, the host may select a command register file (CRF) access mode and may transmit a plurality of instructions to the memory device in the CRF access mode. For example, the CRF may correspond to the instruction memory storing the instructions in the above-described embodiments and the host may access the CRF of the memory device. In addition, the host may provide an address so that the memory device operates in an operation mode. Accordingly, an operation may be processed by the processing element provided in the memory device.

Figure 11:
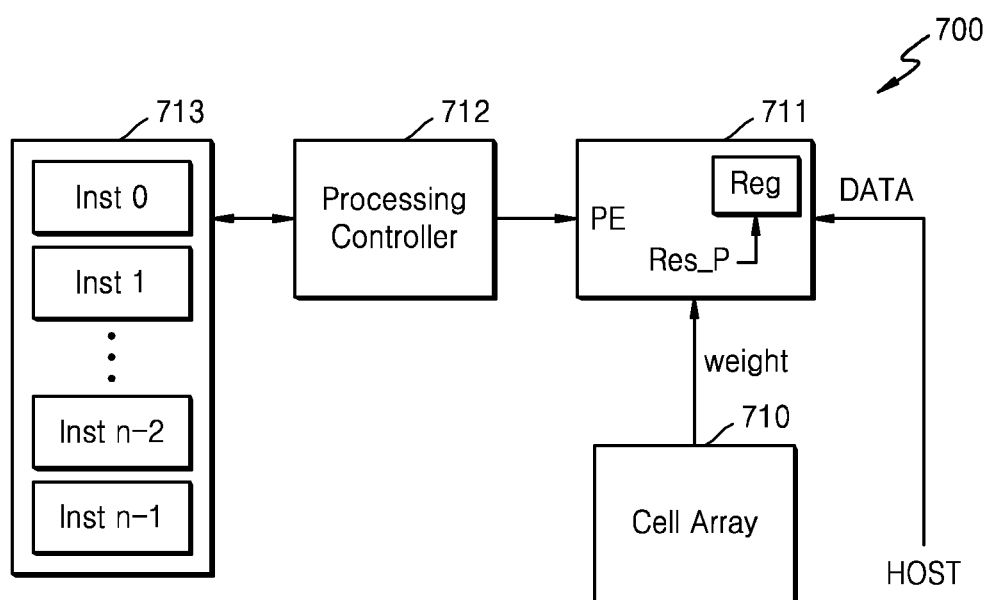
FIG. 11 is a view illustrating an example in which a memory device according to exemplary embodiments of the inventive concept performs a neural network operation.

FIG. 11 is a view illustrating an example in which a memory device according to exemplary embodiments of the inventive concept performs a neural network operation.

A processing operation of a memory device 700 of FIG. 11 may analyze input data using one or more neural network models to extracting information. For example, the processing operation may analyze input data using a deep learning algorithm. The neural network operation may be executed by various kinds of hardware (or processors) such as general hardware or dedicated hardware. The general hardware may include a central processing unit (CPU) or a graphics processing unit (GPU). The dedicated hardware may be optimized for particular software. For example, the dedicated hardware may include various kinds of hardware such as an application specific integrated circuit (ASIC), a neural processing unit (NPU), a tensor processing unit (TPU), and a neural engine.

According to an exemplary embodiment of the inventive concept, a data processing system may include a host (not shown) and the memory device 700. In the host executing a neural network, some operations may be processed by general hardware and/or dedicated hardware. At least some operations included in the neural network may be processed by the memory device 700 according to embodiments of the inventive concept. In an alternate embodiments, all of a plurality of operations included in the neural network are processed by the memory device 700.

Referring to FIG. 11, the memory device 700 includes a cell array 710, a processing element 711, a processing controller 712, and instruction memory 713. For example, the processing element 711, the processing controller 712, and the instruction memory 713 may be included in the PIM circuit in the above-described embodiments. In addition, according to various embodiments, the components may be implemented in various positions in the memory device 700. For example, the memory cell array 710 and the processing element 711 may be included in the same bank.

Neural network operations may include an operation using data DATA and a weight. Various information items used for the operation may be provided by the host HOST or may be stored in the memory device. For example, in FIG. 11, the data DATA is provided by the host HOST and the weight is stored in a bank of the cell array 710. However, embodiments of the inventive concept are not limited thereto. For example, the data DATA may be stored in the cell array 710 or may be read from the cell array 710 for an operation and the weight may be provided by the host HOST.

Whenever a command/address for processing an operation is received, a program counting operation for selecting an instruction stored in the instruction memory 713 is performed and, in accordance with the instruction, the processing element 711 may process the operation by using the data DATA and the weight to generate an operation result Res_P. In addition, the operation result Res_P may be stored in a register in a PIM circuit. For example, in FIG. 11, the register is illustrated as being included in the processing element 711.

According to an exemplary embodiment, the memory device 700 includes a plurality of processing elements corresponding to a plurality of banks and an operation may be performed in parallel by the plurality of processing elements. As an operation example, the neural network operation may operate on the same data DATA with a plurality of different weights and the different weights may be respectively stored in a plurality of banks. In addition, the data DATA (for example, data provided by the host) may be commonly provided to the plurality of processing elements. Accordingly, the plurality of processing elements may operate on the same data DATA with different weights in parallel.

Figure 12:
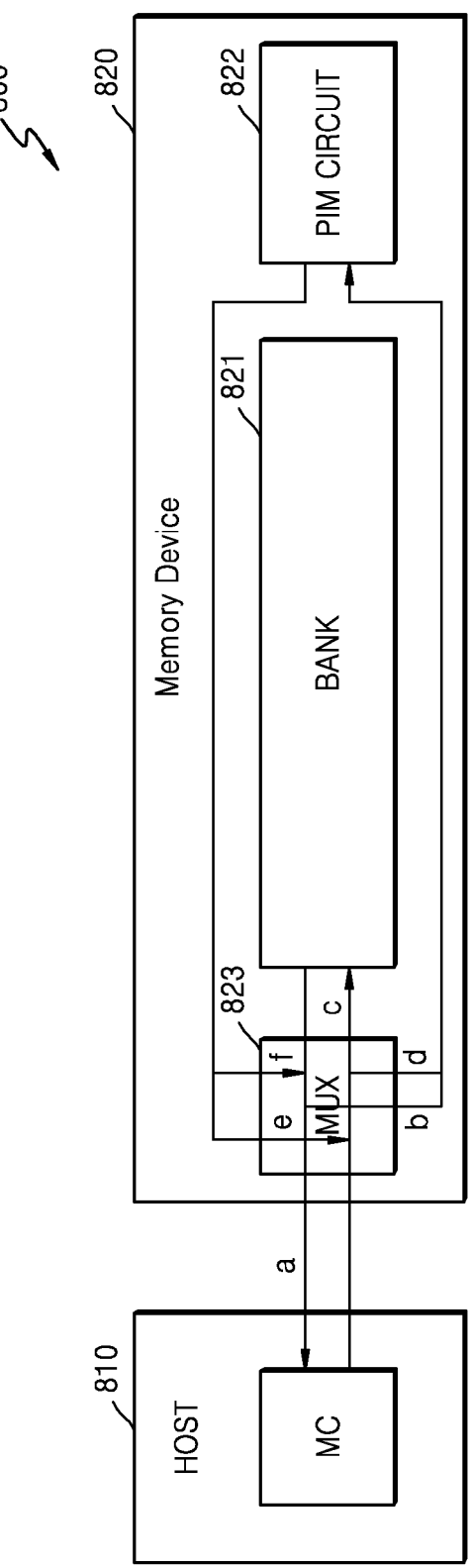
FIG. 12 is a block diagram illustrating an example of a transmission path of information in a memory device according to an exemplary embodiment of the inventive concept.

FIG. 12 is a block diagram illustrating an example of a transmission path of information in a memory device according to an exemplary embodiment of the inventive concept.

Referring to FIG. 12, a data processing system 800 includes a host 810 and a memory device 820 and the host 810 includes a memory controller MC and may communicate with the memory device 820. In addition, the memory device 820 includes at least one bank 821, a PIM circuit 822, and a multiplexer MUX as a route selector 823. The memory device 820 may further include various components for a memory operation and an operation processing operation. However, for convenience sake, the components are not illustrated.

An example of an information transmission route between the host 810 and the memory device 820 will be described below. In the route selector 823, switches (not shown) for controlling a connection relationship among a plurality of buses included in the memory device 820 may be included. The switches may be controlled by the components in the memory device. For example, the switches may be controlled based on a control operation of a command decoder (not shown) and/or a processing controller in the PIM circuit 822 in the memory device 820.

Information read from the bank 821 may correspond to common data, an operation processing result, or information (for example, weight information) used for processing an operation in the above-described embodiments. In addition, data provided by the host 810 may be stored in the bank 821 or may be directly provided to the PIM circuit 822 in order to process an operation.

In an exemplary embodiment, a command/address is provided from the host 810 to the memory device 820, a decoding operation is performed on the command/address in the memory device 820 to generate a decoding region and, in accordance with the decoding result, switching states of the switches of the route selector 823 may change. For example, when the command/address corresponds to a reading request to the bank 821, data read from the bank 821 may be provided to the host 810 through a route a. On the other hand, when the command/address corresponds to an operation processing request performed by using data stored in the bank 821, the data read from the bank 821 may be provided to the PIM circuit 822 through a route b.

On the other hand, when the command/address corresponds to a writing request to the bank 821, the data from the host 810 may be provided to the bank 821 through a route c. On the other hand, when the command/address corresponds to an operation processing request by using data from the host 810, the data from the host 810 may be provided to the PIM circuit 822 through a route d.

On the other hand, the command/address may correspond to information (for example, an operation processing result) stored in the PIM circuit 822. In this case, the information stored in the PIM circuit 822 may be provided to the host 810 through a route f. On the other hand, the command/address may correspond to a request to store the information in the PIM circuit 822 in the bank 821. In this case, the information stored in the PIM circuit 822 may be provided to the bank 821 through a route e.

Figure 13A:
FIGS. 13A and 13B are flowcharts illustrating an implementation example of an instruction executed by a memory device according to an exemplary embodiment of the inventive concept and a method of operating a memory device according to an exemplary embodiment of the inventive concept.
Figure 13B:
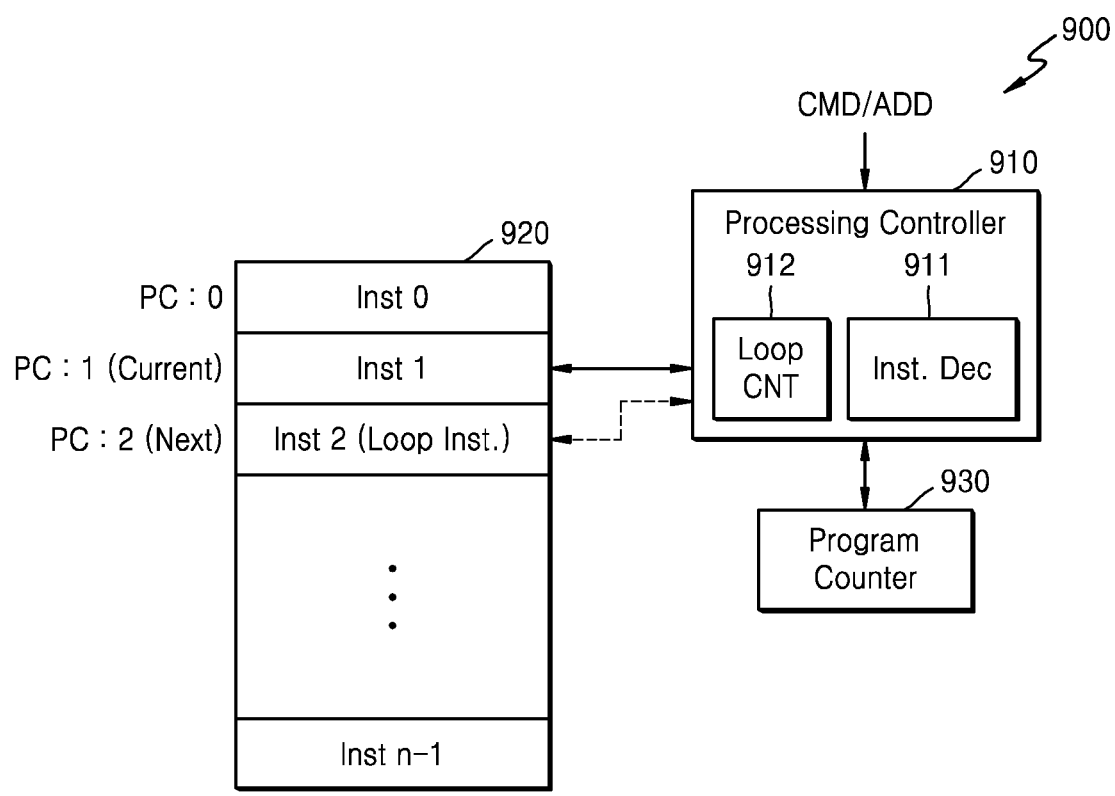

FIGS. 13A and 13B are flowcharts illustrating an implementation example of an instruction executed by a memory device according to an exemplary embodiment of the inventive concept and a method of operating a memory device according to an exemplary embodiment of the inventive concept.

Various kinds of instructions may be provided. For example, a loop instruction for performing a loop may be defined or a branch instruction for branching to a different instruction sequence may be defined. At this time, in a process of processing the loop instruction, additional latency overhead may be generated for processing a branch condition, which deteriorates efficiency in executing the instruction. For example, satisfying the branch condition may cause a loop of the loop instruction to be executed an additional time. On the other hand, when loop unrolling is applied to executing instructions, since a size of a loop basic block increases, a size of memory storing the instructions increases.

According to an exemplary embodiment, an instruction standard architecture (ISA) related to processing of a loop instruction is provided. Referring to FIG. 13A, the loop instruction may include various fields. According to an exemplary embodiment of the inventive concept, the loop instruction includes a FJUMP field representing the loop instruction, a times field representing the number of repetitions of a loop, and a target field representing a position of an instruction to be moved. By including the above-described field information items, a determined number of times of the loop may be executed. For example, each instruction in the loop may be consecutively executed until reaching a last instruction in the loop and then execution may resume to a first instruction in the loop associated with the position stored in the target field.

Referring to FIG. 13B, an operation example of a memory device 900 related to execution of the loop instruction in the above-described example is illustrated. The memory device 900 includes a processing controller 910, instruction memory 920, and a program counter 930. In the instruction memory 920, first to nth instructions Inst 0 to Inst n-1 are stored. In addition, a current program counting value corresponds to 1. Accordingly, in response to the command/address CMD/ADD, a second instruction Inst1 is read. According to the current embodiment, together with the second instruction Inst1, a third instruction Inst2 corresponding to a loop instruction instructed by a next program counting value (for example, PC=2) is read.

The processing controller 910 includes an instruction decoder 911 for performing a decoding operation on an instruction and a loop counter 912 for generating a loop counting value. The instruction decoder 911 may perform a predecoding operation on the read third instruction Inst2. In addition, since the third instruction Inst2 corresponds to the loop instruction, a loop counting value is set to correspond to information in the times field representing the number of times of the loop. The loop counter 912 may increase or reduce the loop counting value whenever the loop is performed once. For example, in a case in which the loop counter 912 performs a counting operation based on a down-counting operation, whenever the loop is performed, the loop counting value is reduced by 1.

The processing controller 910 may determine that an instruction to be read is the loop instruction based on a predecoding result and may control the program counter 930 so that the program counting value instructs the instruction corresponding to the target. Accordingly, when the command/address CMD/ADD instructing the next operation to be processed is received, the loop may be performed by instructing the instruction corresponding to the target without reading and executing the third instruction Inst2.

Figure 14:
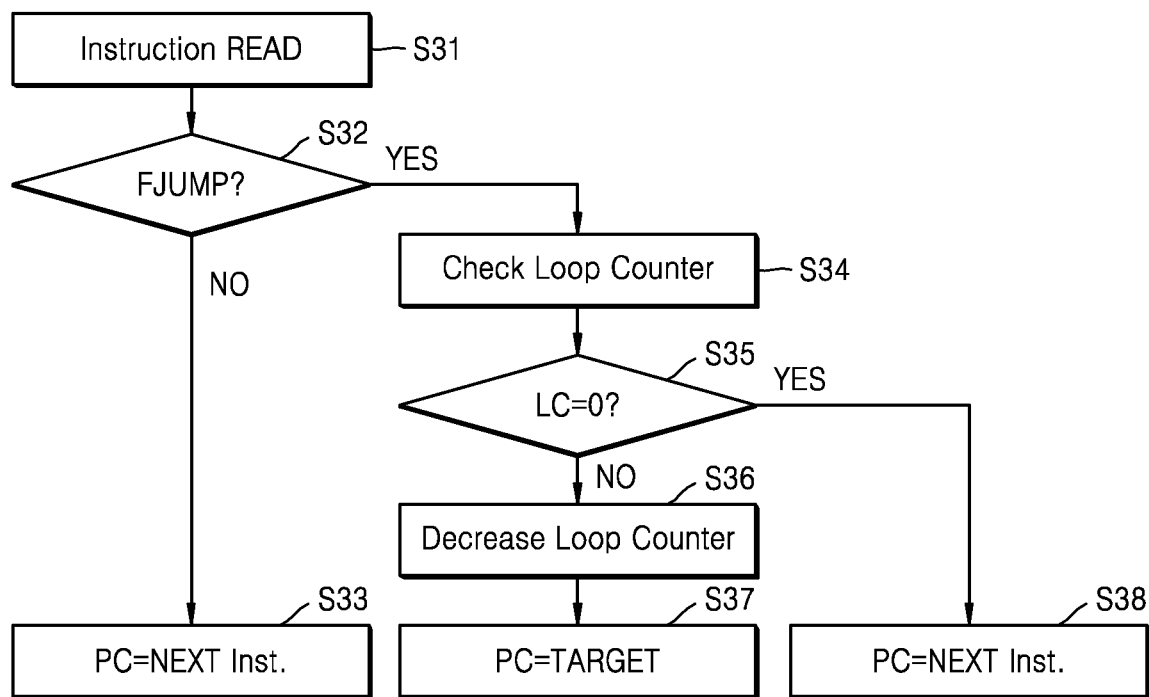
FIG. 14 is a flowchart illustrating an operation example of a memory device according to an exemplary embodiment of the inventive concept executing a loop instruction.

FIG. 14 is a flowchart illustrating an operation example of a memory device according to exemplary embodiment of the inventive concept executing a loop instruction.

Referring to FIG. 14, instructions may be read based on the program counting operation according to the above-described embodiments. For example, based on the command/address from the host to process an operation, an instruction stored in the instruction memory is read in operation S31. In addition, an instruction instructed by a next program counting value is previously read and a predecoding operation may be performed on the instruction. It is determined whether the next instruction corresponds to the instruction FJUMP executing the loop in operation S32. When it is determined that the next instruction is not the instruction FJUMP executing the loop, a program counting value (for example, a current program counting value) is set to a value instructing the next instruction in operation S33. Accordingly, when the command/address instructing a next operation to be processed is received, the next instruction may be subsequently processed.

On the other hand, when it is determined that the next instruction is the instruction FJUMP, an operation of checking a loop counter is performed to determine the number of times of execution of the loop in operation S34 and it is determined whether a loop counting value LC corresponds to 0 in operation S35. When it is determined that the loop counting value LC does not correspond to 0, the down counting operation of the loop counter is performed and accordingly, the loop counting value LC is reduced in operation S36 and a program counting value instructs an instruction corresponding to the target included in the loop instruction in operation S37. Accordingly, when the command/address instructing the next operation to be processed is received, the instruction corresponding to the target may be executed without executing the loop instruction.

On the other hand, when it is determined that the loop counting value LC corresponds to 0, it represents that the loop has executed the determined number of times. Accordingly, the program counting value may change so as to instruct a next instruction in operation S38.

Figure 15A:
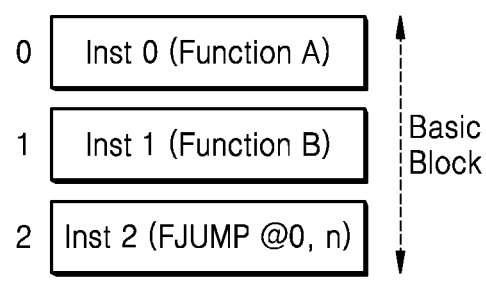
FIGS. 15A and 15B are views illustrating a basic block and an operation example of instructions that perform a loop according to exemplary embodiments of the inventive concept.
Figure 15B:
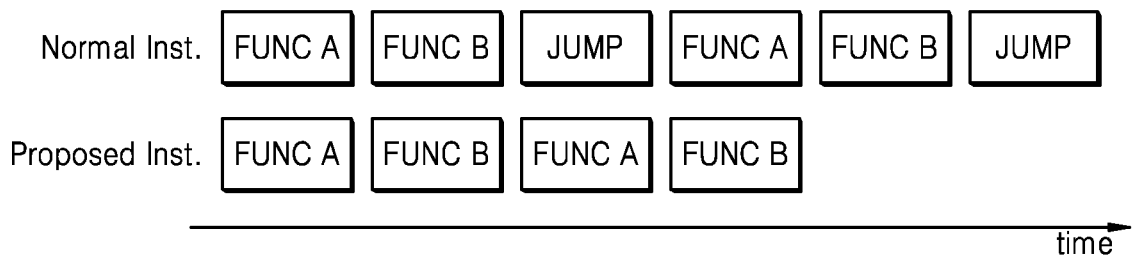

FIGS. 15A and 15B are views illustrating a basic block and an operation example of instructions that perform a loop (execute a loop instruction) according to exemplary embodiments of the inventive concept.

Referring to FIG. 15A, a basic block (e.g., a code block) includes one or more instructions. For example, in the basic block, the first instruction Inst0 performing a first function Function A, the second instruction Inst1 performing a second function Function B, and the third instruction Inst2 performing a moving function JFUMP for executing a loop may be included. In addition, information @0 on a position of a target and information n representing the number of times of a loop may be included in the third instruction Inst2. In addition, according to the above-described embodiments, when the current program counting value is 1, together with the second instruction Inst1, the third instruction Inst2 is read and a predecoding operation may be performed.

On the other hand, in FIG. 15B, a case in which instructions including a loop instruction in a common case are processed and a case in which instructions including a loop instruction according to an exemplary embodiment of the inventive concept are processed are illustrated.

Referring to FIG. 15B, when the basic block of FIG. 15A is executed by a common method, one instruction is read from each operation timing and accordingly, the first function Function A, the second function Function B, and the moving function JUMP may be sequentially performed. On the other hand, according to an exemplary embodiment of the inventive concept, when the current program counting value instructs the second instruction Inst1, a predecoding operation on the third instruction Inst2 is performed. Accordingly, without additionally executing the moving function JUMP, the first function Function A and the second function Function B may be repeatedly performed the determined number of times.

Figure 16A:
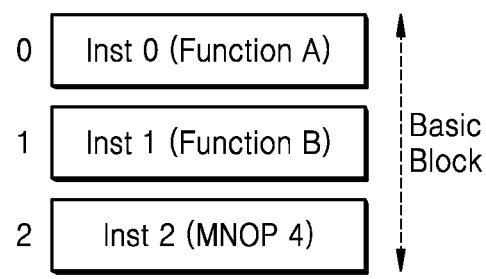
FIGS. 16A, 16B, and 17 are views illustrating an implementation example of an instruction according to an exemplary embodiment of the inventive concept and a method of operating an instruction according to an exemplary embodiment of the inventive concept.
Figure 16B:
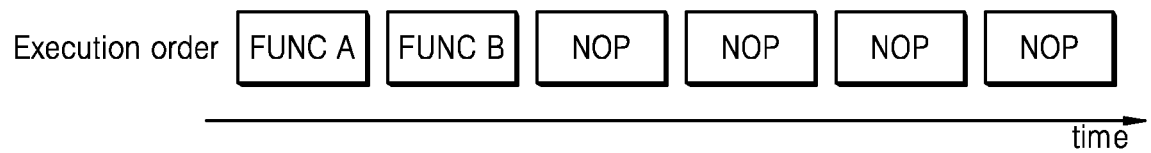
Figure 17:
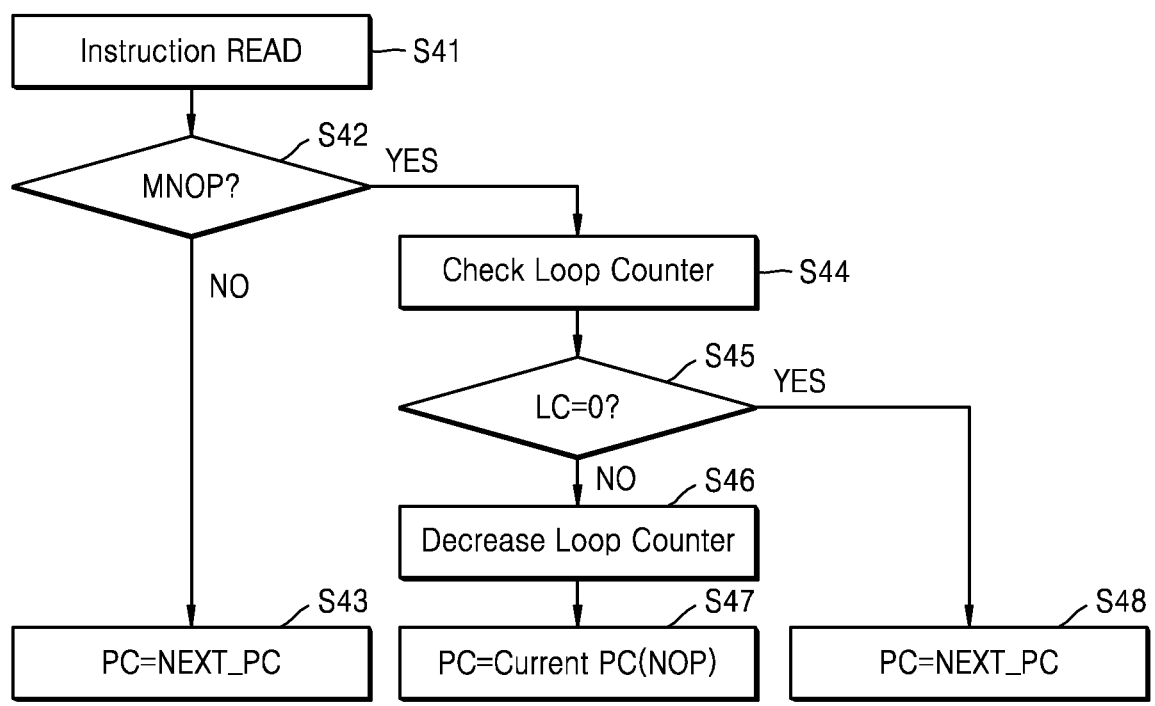

FIGS. 16A, 16B, and 17 are views illustrating an implementation example of an instruction according to an embodiment of the inventive concept and a method of operating an instruction according to embodiment of the inventive concept. In FIGS. 16A, 16B, and 17, an instruction (for example, a multicycle no operation (NOP) instruction) executing NOP the determined number of times is illustrated.

Referring to FIG. 16A, a basic block includes one or more instructions. For example, in the basic block, a first instruction Inst0 performing a first function Function A, a second instruction Inst1 performing a second function Function B, and a third instruction Inst2 performing NOP (MNOP4) during a multicycle are included. In addition, in the third instruction Inst2, information representing a NOP instruction and information representing the number of times of cycles in which the NOP is performed may be included. In an example of FIG. 16A, NOP is performed in four cycles. In executing the basic block illustrated in FIG. 16A, the predecoding operation according to the above-described embodiment may be applied or only one instruction may be read in one operation processing cycle.

In comparison with a case in which a plurality of instructions are stored in memory in order to perform NOP in the multicycle, when the multicycle NOP instruction is defined according to the embodiment illustrated in FIG. 16A, a size of the basic block may be reduced. For example, a NOP may be executed for various purposes such as provision of a prescribed delay to instruction processing. Accordingly, a plurality of instructions performing the NOP a plurality of number of times need to be stored. However, by defining a multicycle NOP instruction according to the embodiment of the inventive concept, the instruction memory may be efficiently used.

On the other hand, FIG. 16B illustrates an example in which the NOP is performed the plurality of number of times in accordance with the multicycle NOP instruction. After the first function Function A and the second function Function B are performed, the plurality of number of times of NOP may be performed. As an operation example, the processing controller maintains the current program counting value at a prescribed number of times without increasing the program counting value based on a result of decoding the multicycle NOP instruction. Accordingly, a NOP may be performed in the multicycle.

FIG. 17 illustrates an operation example of a memory device according to a multicycle NOP instruction. For example, an instruction instructed by the current program counter is read and decoded in operation S41 and it is determined whether the current instruction corresponds to the multicycle NOP instruction MNOP in operation S42. When the current instruction does not correspond to the multicycle NOP instruction MNOP, a program counting value (for example, a current program counting value) has a value instructing a next instruction in operation S43. Accordingly, when a command/address instruction of a next operation to be processed is received, the next instruction may be subsequently performed.

On the other hand, when the current instruction corresponds to the multicycle NOP instruction, an operation of checking a loop counter to determine the number of times of execution of the NOP is performed in operation S44 and it is determined whether the loop counting value LC corresponds to 0 in operation S45. When it is determined that the loop counting value LC does not correspond to 0, based on a down counting operation, the loop counting value LC is reduced in operation S46 and, by performing the NOP, the program counting value is maintained at the current value in operation S47. When it is determined that the loop counting value LC corresponds to 0, it represents that the NOP has been executed the determined number of times. Accordingly, the program counting value changes to instruct a next instruction in operation S48.

Figure 18:
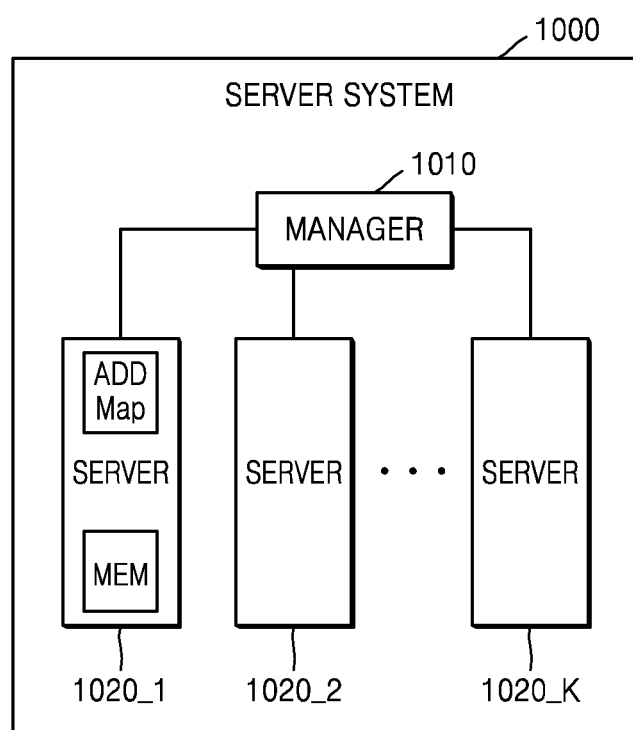
FIG. 18 is a block diagram illustrating a server system including a data processing system according to exemplary embodiment of the inventive concept.

FIG. 18 is a block diagram illustrating a server system 1000 including a data processing system according to an exemplary embodiment of the inventive concept.

Referring to FIG. 18, the server system 1000 includes a manager 1010 (e.g., a controller or control circuit) and a plurality of servers 1020_1 to 1020_K. Each of the plurality of servers 1020_1 to 1020_K may correspond the data processing system described in the above-described embodiments. The plurality of servers 1020_1 to 1020_K are connected to each other through a bus that supports a prescribed protocol (for example, PCI or PCIe). For example, the plurality of servers 1020_1 to 1020_K may communicate with each other through a P2P connection structure based on control of the manager 1010.

Referring to one server (for example, a first server 1020_1), the first server 1020_1 includes the host HOST according to the above-described embodiments and one or more memory devices MEM may process various kinds of operations in accordance with a function of the first server 1020_1 to generate a processing result, and may store the processing result. According to an embodiment, the first server 1020_1 includes an address map ADD Map in a host and a memory device MEM. The memory device may include processing elements according to the above-described embodiments, and the host may control operation processing timing of the memory device MEM. In addition, according to the above-described embodiments, the memory device MEM may determine an operation processing timing by decoding a command/address from the host. In at least one exemplary embodiment, the server system 1000 corresponds to a neural network server system and the first server 1020_1 controls the memory device MEM so that at least part of a large amount of neural network operations may be processed by the memory device MEM.

While the inventive concept has been particularly shown and described with reference to embodiments thereof, it will be understood that various changes in form and details may be made therein without departing from the spirit and scope of the inventive concept.

What is claimed is:

1. A memory device comprising:
   a memory comprising a memory bank including memory cells;
   a processor in memory (PIM) circuit configured to process an operation using host data provided by a host or read data read from the memory bank, the PIM circuit including an instruction memory, the host transmitting a plurality of instructions to the memory device for storage in the instruction memory while the memory device is in an instruction loading mode;
   a program counter configured to output a counting value indicating an instruction position of a single instruction in the instruction memory among the plurality of instructions; and
   control logic configured to decode a command and an address received from the host to generate a decoding result and cause the memory device to enter one of a memory operation mode and an operation processing mode based on the decoding result after storage of the instructions in the instruction memory has completed during the instruction loading mode,
   wherein the control logic performs a control operation so that a memory operation is performed on the memory bank, when a bit value of at least one bit of the address belongs to a first range for the memory device to enter the memory operation mode, and
   wherein the control logic performs a control operation so that the PIM circuit reads the single instruction from the instruction memory using the instruction position, reads an operand from an operand position in the memory bank indicated by a row address and a column address included in a part of the address different from the at least one bit, and performs a processing operation corresponding to the read instruction on the operand, when the bit value belongs to a second range different from the first range for the memory device to enter the operation processing mode, and
   wherein, in the instruction loading mode, the plurality of instructions are stored in the instruction memory in an order irrelevant to the order of the instructions provided from the host.

2. The memory device of claim 1, wherein the PIM circuit performs the processing operation by using the operand read from the operand position of the memory bank when the command corresponds a read command, and wherein the PIM circuit performs the processing operation using the host data provided by the host when the command corresponds to a write command.

3. The memory device of claim 1, wherein the row address indicates a row of the memory bank and the column address indicates a column of the memory bank.

4. The memory device of claim 1, wherein the PIM circuit further comprises:
   a processing controller configured to perform a control operation so that an instruction operation corresponding to an instruction instructed by the counting value of the program counter is processed; and
   at least one processing element configured to perform the instruction operation based on control of the processing controller.

5. The memory device of claim 4, wherein the at least one processing element comprises a plurality of processing elements, the memory comprises a plurality of memory banks including the memory bank, and the plurality of processing elements are respectively arranged to correspond to the memory banks.

6. The memory device of claim 4, wherein each of the plurality of processing elements is shared by at least two of the memory banks.

7. The memory device of claim 1, wherein, when the command and the address instructing the processing operation to be performed is received, a first instruction instructed by a current counting value of the program counter and a second instruction instructed by a next counting value of the program counter are read together, and a predecoding operation is performed on the second instruction.

8. The memory device of claim 7, wherein, when the second instruction corresponds to a loop instruction, the second instruction includes information on a position of a third instruction to be moved, and wherein the PIM circuit executes the third instruction without executing the second instruction when a second command and second address instructing a next operation to be processed is received.

9. The memory device of claim 1, wherein the operation is for neural network processing, and the PIM circuit performs the processing operation using the host data from the host and weight information in the memory bank.

10. A method of operating a memory device comprising a memory including a plurality of memory banks, the method comprising:
    storing a plurality of instructions received from a host that correspond to a processing operation in an instruction memory of the memory device while the memory device is in an instruction loading mode;
    decoding an address received from the host to determine whether the address belongs to one of a first range and a second range different from the first range;
    decoding a command received from the host to determine whether to process an operand received from the host or an operand stored in one of the memory banks when the address belongs to the second range;
    the memory device entering a memory operation mode when it is determined that the address belongs to the first range and entering an operation processing mode when it is determined that the address belongs to the second range, after storage of the plurality of instructions in the instruction memory completes during the instruction loading mode;
    performing a memory operation corresponding to the received command and the received address when the memory device enters the memory operation mode; and
    reading a given instruction among the plurality of instructions and a processor in memory (PIM) circuit provided in the memory device performing a processing operation corresponding to the read given instruction on the operand when the memory device enters the operation processing mode,
    wherein it is determined that the address belongs to one of the first range and the second range from a bit value of at least one bit of the address, and
    wherein a part of the received address different from the at least one bit indicates a position of the operand in the one memory bank through a row address and a column address included in information of the part, when it is determined that the operand stored in the one memory bank is to be processed, and
    wherein, in the instruction loading mode, the plurality of instructions are stored in the instruction memory in an order irrelevant to the order of the instructions provided from the host.

11. The method of claim 10, wherein the reading of the instruction comprises:

checking a counting value of a program counter instructing a position of instruction memory in which the plurality of instructions are stored, and performing counting of the program counter in response to the command and the address instructing the processing operation to be performed.

12. The method of claim 10, wherein, at least some bits of the address comprise address information on a position of data stored in a memory bank of the plurality of memory banks, and wherein the processing operation is performed by using data read from the position.

13. A data processing system comprising a host, wherein the host comprises:

address map memory configured to store a plurality of addresses that belong to a first range for instructing a memory operation to be performed on a memory device and a plurality of addresses that belong to a second range for instructing a processing operation to be performed using data read from a selected memory bank among memory banks of a memory of the memory device; and a memory interface configured to store an instruction associated with the memory operation and at least one other instruction in an instruction memory of the memory device while a mode of the memory device is an instruction loading mode, wherein the memory interface is configured to output an address including at least one bit having a bit value that belongs to the first range for setting the mode to a memory operation mode to perform a data access of the memory device, wherein the memory interface is configured to output the address including the at least one bit having the bit value that belongs to the second range for setting the mode to an operation processing mode to instruct that the processing operation be performed on an operand, output a write command to indicate the operand is to be received from the host, and output a read command to indicate the operand is to be read from the selected memory bank, wherein a part of the address that belongs to the second range different from the at least one bit indicates a position of the operand in the selected memory bank through a row address and a column address included in information of the part, wherein the setting of the mode to the memory operation mode or the operation processing mode occurs after storage of the instruction and the at least one other instruction completes during the instruction loading mode, wherein, in the instruction loading mode, the plurality of instructions are stored in the instruction memory in an order irrelevant to the order of the instructions provided from the host.

14. The data processing system of claim 13, further comprising the memory device including the plurality of banks, wherein the memory device comprises:

a processor in memory (PIM) circuit configured to process an operation by using the operand provided by the host when the write command is received and the operand read from the selected memory bank when the read command is received; and control logic configured to decode a command and an address received from the host to generate a decoding result and to perform a control operation so that one of i) the memory operation on the memory banks is performed and ii) the PIM circuit performs the processing operation based on the decoding result.

15. The data processing system of claim 14, wherein the PIM circuit comprises:

instruction memory configured to store a plurality of instructions provided by the host; and a program counter configured to output a counting value instructing a position of the instruction memory, and wherein, in response to the command and the address instructing the processing operation to be performed, counting of the program counter is performed.

16. The data processing system of claim 14, wherein, in the command and the address instructing the processing operation to be performed, address information on a position of data stored in the selected bank is included in the address, and wherein the PIM circuit performs the processing operation by using data read from a position corresponding to the address of the selected bank.

17. The memory device of claim 1, wherein a third range is further defined regarding a mode in which the memory device operates, and the memory device enters the instruction loading mode when the bit value belongs to the third range different from the first range and the second range.

* * * * *